US010168365B2

(12) United States Patent
Meltzer et al.

(10) Patent No.: US 10,168,365 B2
(45) Date of Patent: *Jan. 1, 2019

(54) MICROFABRICATED CALORIMETER FOR RF POWER MEASUREMENT

(71) Applicants: Bird Technologies Group Inc., Solon, OH (US); The Research Foundation of the State University of New York, Amherst, NY (US)

(72) Inventors: Joel D. Meltzer, Mentor, OH (US); Albert H. Titus, Buffalo, NY (US); Bilel Neji, Amherst, NY (US); Jing Xu, Buffalo, NY (US)

(73) Assignees: Bird Technologies Group Inc., Solon, OH (US); The Research Foundation for the State University of New York, Amherst, NY (US)

( * ) Notice: Subject to any disclaimer, the term of this patent is extended or adjusted under 35 U.S.C. 154(b) by 404 days.

This patent is subject to a terminal disclaimer.

(21) Appl. No.: 14/769,798

(22) PCT Filed: Feb. 20, 2014

(86) PCT No.: PCT/US2014/017426
§ 371 (c)(1),
(2) Date: Sep. 30, 2015

(87) PCT Pub. No.: WO2014/130689
PCT Pub. Date: Aug. 28, 2014

(65) Prior Publication Data
US 2016/0025783 A1    Jan. 28, 2016

Related U.S. Application Data

(60) Provisional application No. 61/767,872, filed on Feb. 22, 2013.

(51) Int. Cl.
*G01R 21/02* (2006.01)
*G01K 17/08* (2006.01)

(52) U.S. Cl.
CPC ............. *G01R 21/02* (2013.01); *G01K 17/08* (2013.01)

(58) Field of Classification Search
None
See application file for complete search history.

(56) References Cited

U.S. PATENT DOCUMENTS 3,869,914 A    3/1975   Koehler et al.
4,048,852 A    9/1977   Sakakibara et al.
(Continued)

FOREIGN PATENT DOCUMENTS

CH    549213 A      5/1974
CN    101126780     2/2008
(Continued)

OTHER PUBLICATIONS

Carr, "Measuring RF Power" Electronics World, Nexus Media Communication, Swanley, Kent, GB, vol. 105, No. 1764, Dec. 1, 1999, pp. 1000-1005.*

(Continued)

*Primary Examiner* — Daniel Miller
(74) *Attorney, Agent, or Firm* — Wegman, Hessler & Vanderburg

(57) ABSTRACT

Disclosed is a radio frequency (RF) power calorimeter having a load electrically coupled to a RF input, a variable low-frequency power source electrically coupled to the load and configured to apply low-frequency bias to the load. The RF power calorimeter includes a thermal medium thermally coupled to the load. Additionally, the RF power calorimeter includes an outlet temperature sensor thermally coupled to the thermal medium, the outlet temperature sensor being
(Continued)

positioned to measure the temperature of the thermal medium due to heating by the load. The RF power calorimeter also has circuitry configured to use temperature measurements of the thermal medium in thermal contact with an RF load in combination with the low-frequency bias to measure average power of an RF source electrically coupled to the RF input. Also disclosed in a method of measuring RF power using the RF power calorimeter.

13 Claims, 17 Drawing Sheets

(56) References Cited

U.S. PATENT DOCUMENTS

| | | | |
|---|---|---|---|
| 4,223,264 | A | 9/1980 | Yamamura et al. |
| 4,531,843 | A | 7/1985 | Kuhnlein et al. |
| 5,156,459 | A | 10/1992 | Baker |
| 5,186,540 | A | 2/1993 | Walsh et al. |
| 5,343,755 | A | 9/1994 | Huss |
| 5,965,410 | A | 10/1999 | Chow |
| 6,759,839 | B2 | 7/2004 | Kodato |
| 7,360,439 | B2 | 4/2008 | Kuroda |
| 8,562,210 | B2 | 10/2013 | Abadeer |
| 2008/0114555 | A1 | 5/2008 | Scott |
| 2010/0046573 | A1 | 2/2010 | Schick et al. |
| 2012/0149322 | A1 | 6/2012 | Kuo |

FOREIGN PATENT DOCUMENTS

| | | |
|---|---|---|
| CN | 102494808 A | 6/2012 |
| CN | 102593120 A | 7/2012 |
| EP | 0092042 B1 | 9/1987 |
| EP | 0720022 | 7/1996 |
| EP | 2475007 | 7/2012 |
| GB | 1544270 A | 4/1979 |
| JP | S525571 U | 6/1976 |
| JP | 2005517963 A | 6/2005 |
| JP | 2008287999 A | 11/2008 |
| TW | 272256 | 3/1996 |

OTHER PUBLICATIONS

Making Flexible Molds with PDMS, Available on the Internet before Feb. 22, 2013, 7 pages.
PDMS Soft Lithography, Feb. 12, 2013, 1 page, http://en.wikipedia.org/wiki/Polydimethylsiloxane.
S. F. Abd Rahman et al., Fabrication of nano and micrometer structures using electron beam and optical mixed lithography process, 2011, pp. 49-58, Int. J. Nanoelectronics and Materials 4 (2011) 49-58.
Yang, Xiang, Electron Beam Lithography—Application, Available on the Internet before Feb. 22, 2013, 12 pages, https://www.yumpu.com/en/document/view/3336175/electron-beam-lithography-application-seas-university-pf-/5.
Office Action of Related Chinese Patent Application No. 201480022437.3, dated Mar. 1, 2017, pp. 1-11.
Yang, Xiang; "Electron Beam Lithography—Application"; Penn Engineering, University of Pennsylvania; http://www.seas.upenn.edu/~yxiang/courses/Final%20Paper_EBL_Xiang%20Yang_ESE%20574.pdf.
International Search Report and Written Opinion dated Jun. 24, 2014 for corresponding application No. PCT/US2014/017426.
"Power Measurement—1998 Back to Basics Seminar" by Boyd Shaw, Agilent Technologies, Japan, online, Dec. 22, 2014, 5-4 to 5-13, URL https://web.archive.org/web/20141222023030/http://literature.cdn.keysight.com/litweb/pdf/00/2566.pdf.
Japan Office Action for corresponding Japan application No. 2015-558960 dated Jan. 9, 2018.
Corrected Notice of Allowability dated Feb. 16, 2018 for U.S. Appl. No. 14/185,298; (pp. 1-2).
Devendhiran ("A Microfabricated dc-substitution calorimeter for low power measurement". Master Thesis for SUNY Department of Electrical Engineering , Oct. 2011).
Erickson (A Fast and Sensitive Submillimeter Waveguide Power Meter, Tenth International Symposium on Space Terahertz Technology, Charlottesville, Mar. 1999, pp. 501-507).
Extended European Search Report (EESR) for corresponding European patent application No. 14753815.1 dated Oct. 17, 2016.
Hollway et al., "The Precise Measurement of RF Power and Voltage Using Coaxial Calorimeters and Vlicrocalorimeters", IEEE Transactions on Instrumentation and Measurement, IEEE Service 7, Enter, vol. IM-33, No. 4, Dec. 1, 1984, pp. 269-275, XP001456585.
Mellouet et al ("Fast Method Applied to the Measurement of Microwave Power Standards", IEEE Transactions on Instrumentation and Measurement vol. 50 No. 2, Apr. 2001).
Neji Bilel et al., "Micro-fabrication of an absolute flow calorimeter for DC to RF power measurement", 2013 IEEE 56th International Midwest Symposium on Circuits and Systems, Aug. 4, 2013, pp. 701-704, XP032525645.
Notice of Allowance dated Sep. 21, 2017 for U.S. Appl. No. 14/185,298; (pp. 1-9).
Rumfelt et al., "Radio Frequency Power Measurements", Proceedings of the IEEE, vol. 55, No. 6, Jun. 28, 1967, pp. 837-850, XP055307552.
Sarr, "Measuring RF Power" Electronics World, Nexus Media Communications, vol. 105, No. 1764, Dec. 1, 1999, pp. 1000-1005, XP000949684.
Semi E136-1104: "Test Method for Determining the Output Power of RF Generators Used in Semiconductor Processing Equipment RF Power Delivery Systems", Nov. 1, 2004, pp. 1-5, XP040455430.
Taiwan Office Action for corresponding Taiwan application No. 103105806 dated Jul. 13, 2017.
Office Action dated Feb. 3, 2017 for U.S. Appl. No. 14/185,298; (pp. 1-10).
Office Action dated Jun. 2, 2016 for U.S. Appl. No. 14/185,298; (pp. 1-13).
Notice of Final Rejection for corresponding Japanese Application No. 2015-558960 dated Aug. 28, 2018.

* cited by examiner

MICROFABRICATED CALORIMETER FOR RF POWER MEASUREMENT

CROSS-REFERENCE TO RELATED APPLICATIONS

This application is the US National phase entry of International Patent Application No. PCT/US2014/017426 filed Feb. 20, 2014, which claims priority to U.S. Provisional Patent Application Ser. No. 61/767,872 filed Feb. 22, 2013 and entitled "MICROFABRICATED CALORIMETER FOR RF POWER MEASUREMENT", all of the above listed applications are incorporated by reference herein. This application is related to U.S. patent application Ser. No. 14/185,298 and entitled, "MICROFABRICATED CALORIMETER FOR RF POWER MEASUREMENT".

FIELD OF THE INVENTION

This invention relates generally to radio frequency (RF) power measurement. In particular, it relates to a microfabricated DC substitution calorimeter for RF power measurement and a method of using the calorimeter.

BACKGROUND OF THE INVENTION

RF power is a frequently measured quantity because other RF electrical quantities like current, voltage, and impedance are difficult to measure and quantify in RF equipment. At low frequencies, power measurement is made by interpretation of voltage and current across a known impedance. However, at higher frequencies, such as RF frequencies, the impedance changes significantly and therefore direct measurement of power is not feasible.

Traditionally, handheld RF power meters have directly measured RF power by directly transducing high frequency RF power into a DC signal, such as by using a Schottky or Gallium-Arsenide diode, and measuring the DC signal. However, the accuracy of meters using these traditional direct measurement techniques are sensitive to the measured RF signal's frequency and waveform.

Accordingly, a need exists for a handheld RF power meter that is insensitive to an RF signal's frequency or waveform.

BRIEF SUMMARY OF THE INVENTION

According to one aspect of the present invention, a radio frequency (RF) power calorimeter is provided. The RF power calorimeter having a load electrically coupled to a RF input, the RF input configured to be electrically coupled to an RF power source; a variable low-frequency power source electrically coupled to the load and configured to apply low-frequency power to the load; a thermal medium thermally coupled to the load; an outlet temperature sensor thermally coupled to the thermal medium, the outlet temperature sensor being positioned to measure the temperature of the thermal medium due to heating by the load; circuitry configured to calculate power of the RF source electrically coupled to the RF input by: determining an average power of the RF source based on temperature measurements of the thermal medium using a variable bias from the low-frequency power source.

In another aspect of the invention, determining an average power of the RF source includes: applying a known low-frequency input to the load, the known low-frequency input having a predetermined power value; measuring a first output temperature of the thermal medium after application of the low-frequency input to the load; applying the RF source to the load during application of the known low-frequency input; measuring a second output temperature of the thermal medium during application of the known low-frequency input and the RF source; reducing the power value of the known low-frequency input while measuring the output temperature of the thermal medium until the output temperature is substantially equal to the first output temperature; determining a power value of the known low-frequency input when the output temperature is substantially equal to the first output temperature; and calculating power of the RF source based on the difference between the predetermined value of the known low-frequency input and the power value of the known low-frequency input when the output temperature is substantially equal to the first output temperature.

In another aspect of the invention, the variable low-frequency power source is an alternating current voltage source.

In another aspect of the invention the variable low-frequency power source is a direct current voltage source.

In another aspect of the invention, the thermal medium is a fluid circulated through thermal medium channels.

In another aspect of the invention, a flowrate of the thermal medium fluid through the thermal medium channels is variable.

In another aspect of the invention, a fluid channel path array comprised of multiple fluid channels is configured to vary the flowrate of the thermal medium fluid through the thermal medium channels.

In another aspect of the invention, the fluid channel path array is comprised of a fluid switch in fluid communication with multiple fluid channels, each fluid channel of the fluid channel path array having a different length and/or hydraulic diameter.

In another aspect of the invention, each fluid channel of the fluid channel path array has a thermal medium pump.

In another aspect of the invention, the thermal medium is a substrate thermally coupled to a heat exchanger.

In another aspect of the invention, the outlet temperature sensor is a Wheatstone bridge.

In another aspect of the invention, the power calorimeter is configured to measure power between about 100 µW and 100 mW.

In another aspect of the invention, the power calorimeter is configured to measure power at frequencies down to 0 Hz and well above 12 GHz.

In another aspect of the invention, the power calorimeter is configured to measure power at frequencies between about 0 Hz and about 12 GHz.

In another aspect of the invention, the RF power calorimeter is further comprised of a non-conductive substrate; wherein the load and output sensor are microfabricated on the non-conductive substrate.

In a further aspect of the invention, the RF power calorimeter is a microfabricated calorimeter having a thermal medium and a low frequency power source; the power calorimeter is configured to determine an average power of an RF source based on temperature measurements of the thermal medium using a variable bias from the low-frequency power source.

According to another aspect of the invention, a method of measuring RF power is provided. The method of measuring RF power includes: providing a load electrically coupled to a RF input; providing a thermal medium thermally coupled to the load; applying a known low-frequency input to the load, the known low-frequency input having a predetermined power value; measuring a first output temperature of the thermal medium after application of the known low-frequency input to the load; applying an unknown RF input to the load during application of the known low-frequency input; measuring a second output temperature of the thermal medium during application of the known low-frequency input and the unknown RF input; reducing the known low-frequency input while measuring the output temperature of the thermal medium until the output temperature is substantially equal to the first output temperature; determining a value of the known low-frequency input when the output temperature is substantially equal to the first output temperature; and calculating power of the RF input based on the difference between the predetermined value of the known low-frequency input and the value of the known low-frequency input when the output temperature is substantially equal to the first output temperature.

In another aspect of the invention, the method is carried out using a microfabricated RF power calorimeter.

In another aspect of the invention, the variable low-frequency input is an alternating current voltage source.

In another aspect of the invention, the variable low-frequency input is a direct current voltage source.

In another aspect of the invention, the thermal medium is a fluid circulated through thermal medium channels.

In another aspect of the invention, a flowrate of the thermal medium fluid through the thermal medium channels is variable.

In another aspect of the invention, a fluid channel path array comprised of multiple fluid channels is configured to vary the flowrate of the thermal medium fluid through the thermal medium channels.

In another aspect of the invention, the fluid channel path array is comprised of a fluid switch in fluid communication with multiple fluid channels, each fluid channel of the fluid channel path array having a different length and/or hydraulic diameter.

In another aspect of the invention, each fluid channel of the fluid channel path array has a thermal medium pump.

In another aspect of the invention, the thermal medium is a substrate thermally coupled to a heat exchanger.

In another aspect of the invention, the output temperature is obtained with a Wheatstone bridge temperature sensor.

In another aspect of the invention, the power calorimeter is configured to measure power between about 100 µW and 100 mW.

In another aspect of the invention, the power calorimeter is configured to measure power at frequencies down to 0 Hz and well above 12 GHz.

In another aspect of the invention, the power calorimeter is configured to measure power at frequencies between about 0 Hz and about 12 GHz.

In another aspect of the invention, the RF power calorimeter is further comprised of a non-conductive substrate; wherein the load and output sensor are microfabricated on the non-conductive substrate.

According to another aspect of the invention, a method of measuring radio frequency power comprises: using temperature measurements of fluid moving over an RF load in combination with a DC bias to measure average power.

According to another aspect of the invention, a method of measuring radio frequency power comprises using temperature measurements of a thermal medium in thermal contact with an RF load in combination with a DC bias to measure average power.

According to another aspect of the invention, a radio frequency (RF) power calorimeter comprises: a load electrically coupled to a RF input; a variable low-frequency power source electrically coupled to the load and configured to apply low-frequency bias to the load; a thermal medium thermally coupled to the load; an outlet temperature sensor thermally coupled to the thermal medium, the outlet temperature sensor being positioned to measure the temperature of the thermal medium due to heating by the load; and circuitry configured to use temperature measurements of the thermal medium in thermal contact with an RF load in combination with the low-frequency bias to measure average power of an RF source electrically coupled to the RF input.

Advantages of the present invention will become more apparent to those skilled in the art from the following description of the embodiments of the invention which have been shown and described by way of illustration. As will be realized, the invention is capable of other and different embodiments, and its details are capable of modification in various respects.

BRIEF DESCRIPTION OF SEVERAL VIEWS OF THE DRAWINGS

These and other features of the present invention, and their advantages, are illustrated specifically in embodiments of the invention now to be described, by way of example, with reference to the accompanying diagrammatic drawings, in which.

Figure 1:
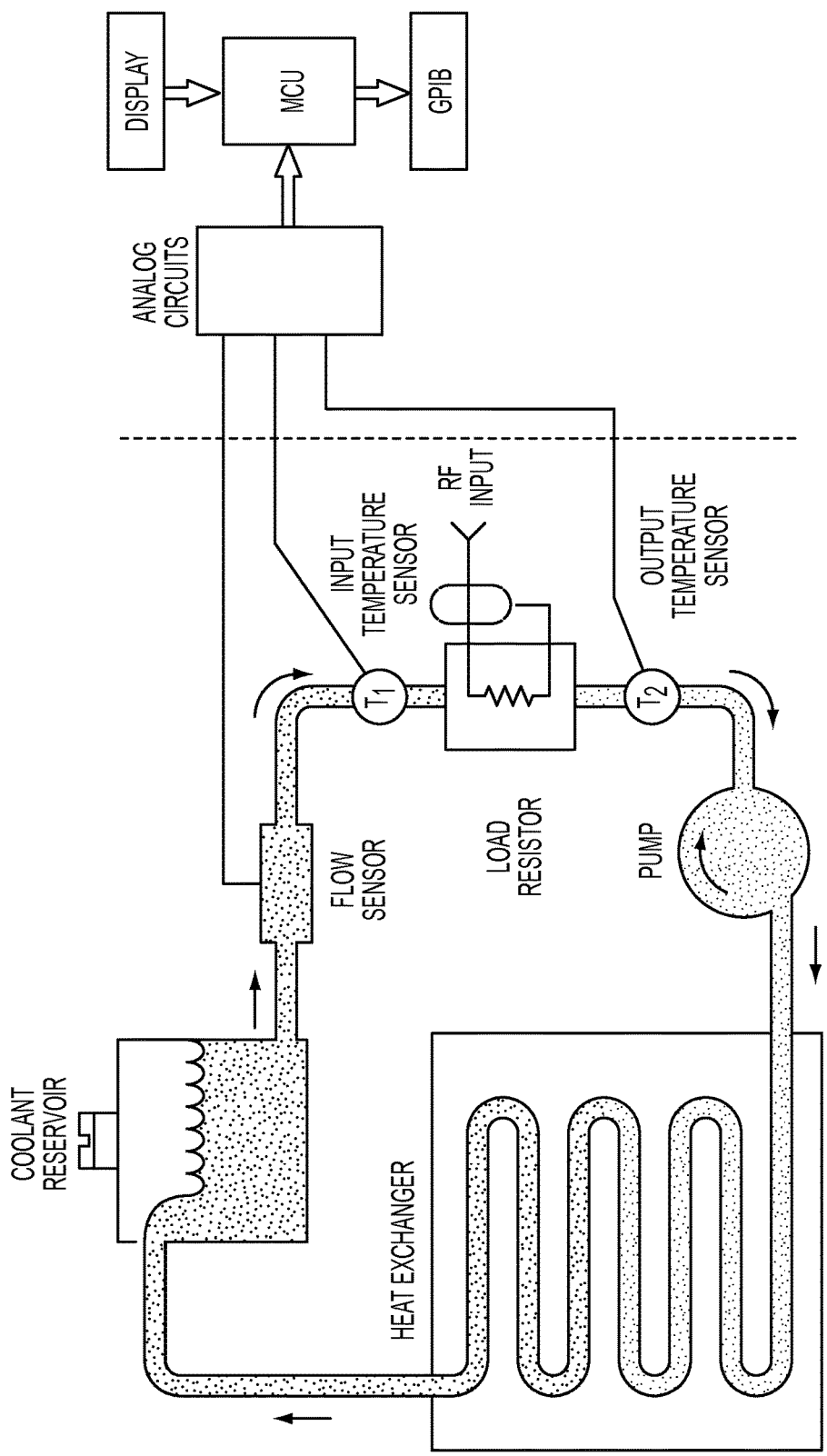
FIG. 1 is a block diagram of a conventional RF absolute flow calorimeter.

It should be noted that all the drawings are diagrammatic and not drawn to scale. Relative dimensions and proportions of parts of these figures have been shown exaggerated or reduced in size for the sake of clarity and convenience in the drawings. The same reference numbers are generally used to refer to corresponding or similar features in the different embodiments. Accordingly, the drawing(s) and description are to be regarded as illustrative in nature and not as restrictive.

DETAILED DESCRIPTION OF THE PREFERRED EMBODIMENT

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In at least some instances, the approximating language may correspond to the precision of an instrument for measuring the value. Range limitations may be combined and/or interchanged, and such ranges are identified and include all the sub-ranges stated herein unless context or language indicates otherwise. Other than in the operating examples or where otherwise indicated, all numbers or expressions referring to quantities of ingredients, reaction conditions and the like, used in the specification and the claims, are to be understood as modified in all instances by the term "about".

"Optional" or "optionally" means that the subsequently described event or circumstance may or may not occur, or that the subsequently identified material may or may not be present, and that the description includes instances where the event or circumstance occurs or where the material is present, and instances where the event or circumstance does not occur or the material is not present.

As used herein, the terms "comprises", "comprising", "includes", "including", "has", "having", or any other variation thereof, are intended to cover a non-exclusive inclusion. For example, a process, method, article or apparatus that comprises a list of elements is not necessarily limited to only those elements, but may include other elements not expressly listed or inherent to such process, method, article, or apparatus.

The singular forms "a", "an", and "the" include plural referents unless the context clearly dictates otherwise.

The basic principle behind microwave RF power measurement is the transducing of high frequency power into a DC signal and measuring the resulting DC signal. RF power measurement calorimeters, such as the absolute flow RF power measurement calorimeter depicted in FIG. 1, have been investigated and have shown to be an acceptable method for the measurement of RF power in certain situations.

A system level block diagram of a conventional RF absolute flow calorimeter is shown in FIG. 1. RF power is passed to the internal load resistor. The load resistor is hollow and has the working fluid flow through it. A pump is used to circulate the fluid from the reservoir to the load and then back to the reservoir after removing the heat by passing it through a heat exchanger. The reservoir is large enough to stabilize the working fluid and keep the average temperature constant. Temperature sensors are used to measure the temperature difference between the fluid before passing through the load and after. The sensors are mostly thermistors due to their fast response and sensitivity. A flow sensor is used to determine the mass flow rate of the fluid through the load. By thermodynamic first principles, the RF power can be determined from the temperature difference, mass flow rate, and specific heat of the fluid.

Absolute flow calorimeters, such as the one depicted in FIG. 1, are too large to be placed in a handheld package, require the use of a flowmeter which increases uncertainty and decreases accuracy, and have a large thermal mass, which results in a lengthy equilibrium period and measurement acquisition time when employing the DC substitution method.

Figure 2:
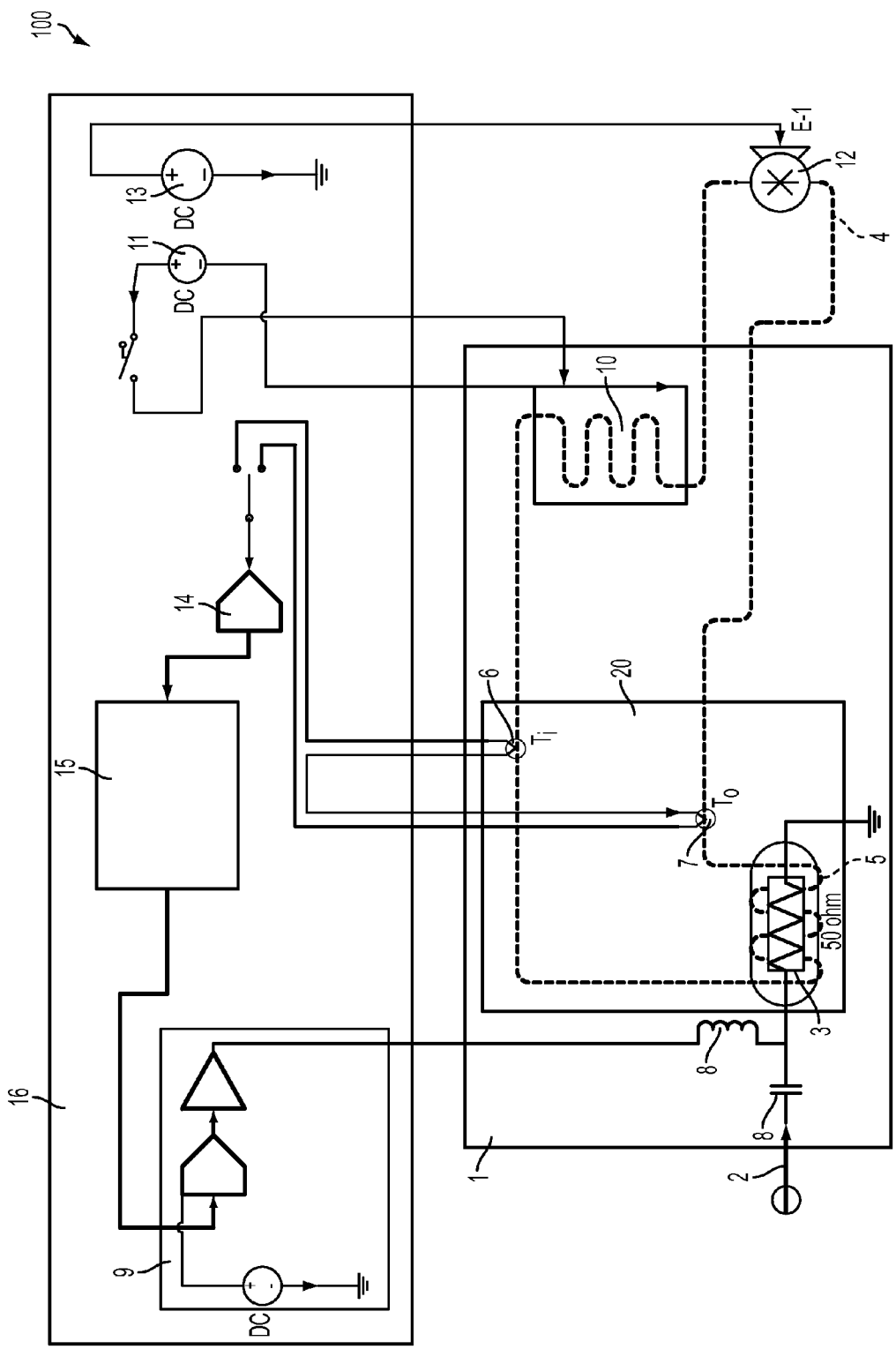
FIG. 2 is a block diagram of a microfabricated RF power measurement calorimeter in accordance with an embodiment of this invention.

However, the microfabricated RF power measurement calorimeter 100 shown in FIG. 2 is capable of measuring signals having an average power of 100 μW to 100 mW. The measured signals can range from a low frequency signal to a signal in excess of 12 GHz. Further, calorimeter 100 of FIG. 2 does not use a flowmeter, which allows for power measurement accuracies to less than 0.2% of reading in a hand-held device form factor.

Turning to FIG. 2, the embodiment of the microfabricated RF power calorimeter 100 shown has a first substrate 1, printed circuit board assembly 16, and RF input 2. Printed circuit board assembly 16 contains variable low frequency power source 9, control and processing electronics 15, temperature measurement electronics 14, heat exchanger power source 11, and pump power source 13. In some embodiments, printed circuit board assembly 16 also contains pump 12. However, in other embodiments, pump 12 is not mounted on printed circuit board assembly 16. First substrate 1 is constructed of glass and provides a base for the following fabricated components: load 3, thermal medium 4, thermal medium channels 5, inlet temperature sensor 6, outlet temperature sensor 7, bias tee 8, and heat exchanger 10. It is contemplated that first substrate 10 could also be constructed of other materials including, but not limited to, quartz, ceramic, silicon, or gallium arsenide (GaAs).

In one exemplary embodiment, RF input 2 can be configured as a transmission line of copper that provides an electrical path to load 3 and current return path 17 from load 3. It is contemplated that the transmission line of RF input 2 could also be constructed of other materials including, but not limited to, aluminum, gold, or platinum. Load 3 is a resistor made of tantalum nitride (TaN) that absorbs electrical energy and converts the electrical energy to heat. It is contemplated that load 3 could also be constructed of other materials including, but not limited to, tantalum, nichrome (NiCr), or rhenium trioxide ($ReO_3$).

In the embodiment of FIG. 2, thermal medium 4 is a mineral oil cooling fluid in thermal medium channels 5 that contacts load 3, inlet temperature sensor 6, outlet temperature sensor 7, and heat exchanger 10. Thermal medium cooling fluid 4 is moved through thermal medium channels 5 by pump 12. The thermal medium cooling fluid 4 receives heat from load 3 and carries the heat to outlet temperature sensor 7. It is contemplated that the thermal medium cooling fluid 4 could also be another material including, but not limited to, water, mineral oil, benzene, methanol, or refrigerant.

Inlet temperature sensor 6 measures the temperature of the thermal medium cooling fluid 4 in thermal medium channels 5 before the cooling fluid passes over and receives heat from load 3. Inlet temperature sensor 6 is used to maintain thermal medium 4 at a constant temperature at inlet temperature sensor 6 when only power from variable low frequency power source 9 is applied to load 3, and when power from both variable low frequency power source 9 and power from RF input 2 are applied to load 3. In this embodiment, inlet temperature sensor 6 is constructed of platinum. However, it is contemplated that the inlet temperature sensor 6 could be constructed of other materials having a high temperature coefficient of resistance (TCR) including, but not limited to, polysilicon or aluminum.

Outlet temperature sensor 7 measures the temperature of the thermal medium cooling fluid 4 in thermal medium channels 5 after the cooling fluid passes over and receives heat from load 3. Outlet temperature sensor 7 is used to ascertain the thermal medium cooling fluid temperature 4 at outlet temperature sensor 7 when only power from variable low frequency power source 9 is applied to load, and also ascertain the thermal medium cooling fluid temperature 4 at outlet temperature sensor 7 when power from RF input 2 is applied to load 3 as power from variable low frequency power source 9 is proportionally removed from load 3, in an effort to determine when the power removed from load 3 by variable low frequency power source 9 is equal to the power applied to load 3 by RF input 2. In this embodiment, outlet temperature sensor 7 is constructed of platinum. However, it is contemplated that the outlet temperature sensor 7 could be constructed of other materials having a high temperature coefficient of resistance (TCR) including, but not limited to, polysilicon or aluminum.

Bias tee 8 is comprised of a discrete capacitor and inductor. Power from variable low frequency power source 9 is applied to load 3 through bias tee 8. Variable low frequency power source 9 is a precision variable DC voltage source or a precision low-frequency AC voltage source.

Heat exchanger 10 is an active or passive heat exchanger that maintains thermal medium cooling fluid 4 at thermal equilibrium through cooling thermal medium 4. When heat exchanger 10 is an active heat exchanger, heat exchanger power source 11 is present and provides power to heat exchanger 10. Further thermal medium pump 12 powered by thermal medium pump power source 13 circulates thermal medium cooling fluid 4 through thermal medium channels 5. In one embodiment, thermal medium pump 12 is a piezoelectric pump, however it is contemplated that a person having ordinary skill in the art can choose to use another suitable type of pump.

Temperature measurement electronics 14 convert electrical signals from inlet temperature sensor 6 and outlet temperature sensor 7 into a voltage or numeric value through the use of an analog to digital converter for further manipulation by control and processing electronics 15. Control and processing electronics 15 read the temperatures of inlet temperature sensor 6 and outlet temperature sensor 7. Further, control and processing electronics 15 also controls the amount of power applied to load 3 by variable low frequency voltage power source 9. Control and processing electronics 15 also have a processor and memory for storing and retrieving the program executed by processor and for processing the temperature measurements of inlet temperature sensor 6 and outlet temperature sensor 7.

As can be seen, microfabricated RF power calorimeter 100 of FIG. 2 is comprised of a thin non-conductive first substrate 1 onto which an absorptive load 3 is mounted. Load 3 is resistive and is comprised of a film deposited on first substrate 1. The shape and size of load 3 are determined such that lowest amount of reflected RF energy is achieved based on the electrical impedance of the RF input (transmission line) 2 connected to microfabricated RF power calorimeter 100. Conductive material is deposited on first substrate 1 around load 3 on the same side of first substrate 1 and functions as the return path for the current to RF input (transmission line) 2. Two temperature sensors, inlet temperature sensor 6 and outlet temperature sensor 7, are deposited near load 3 on first substrate 1, but do not touch load 3. In some embodiments, bias tee 8 is also microfabricated on first substrate 1.

An insulating layer of silicon dioxide is applied over the entire top surface 1a of first substrate 1 covering the aforementioned layers. The bottom surface (not shown) of first substrate 1 is devoid of any deposited material. A second substrate 20 constructed from polydimethylsiloxane (PDMS) is constructed with thermal medium channels 5 to contain a thermal medium cooling fluid 4. The second substrate 20 is bonded to the first substrate 1 such that the thermal medium cooling fluid 4 flowing through thermal medium channels 5 is in contact with and thermally coupled to load 3, inlet temperature sensor 6, and outlet temperature sensor 7.

More specifically, the microfabrication of components on first substrate 1 is performed by first spincoating a positive photoresist (Shipley 1818) on first substrate 1. First substrate 1 is then patterned using a conventional UV photolithography method. Then, aluminum is deposited with E-Beam evaporation. Another layer of Shipley 1818 positive photoresist is applied to cover all patterns and exposed to create the load 3, inlet temperature sensor 6, and outlet temperature sensor 7 pattern. Tantalum nitride is filled into the photoresist mold through DC sputtering, and acetone is used for lift-off.

Figure 4A:
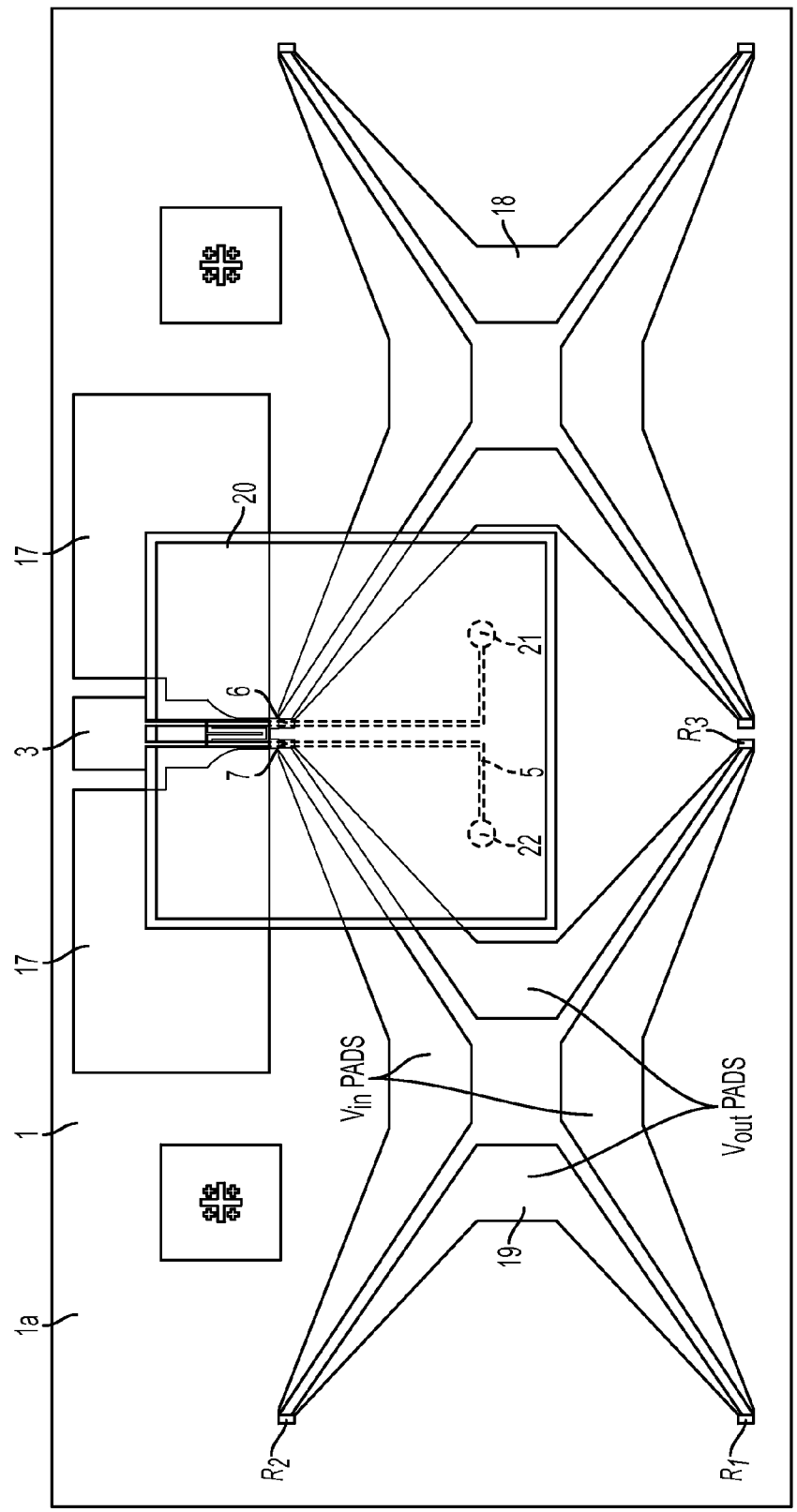
FIG. 4a-b are depictions of a first substrate and a second substrate of a microfabricated RF power measurement calorimeter in accordance with an embodiment of this invention.
Figure 4B:
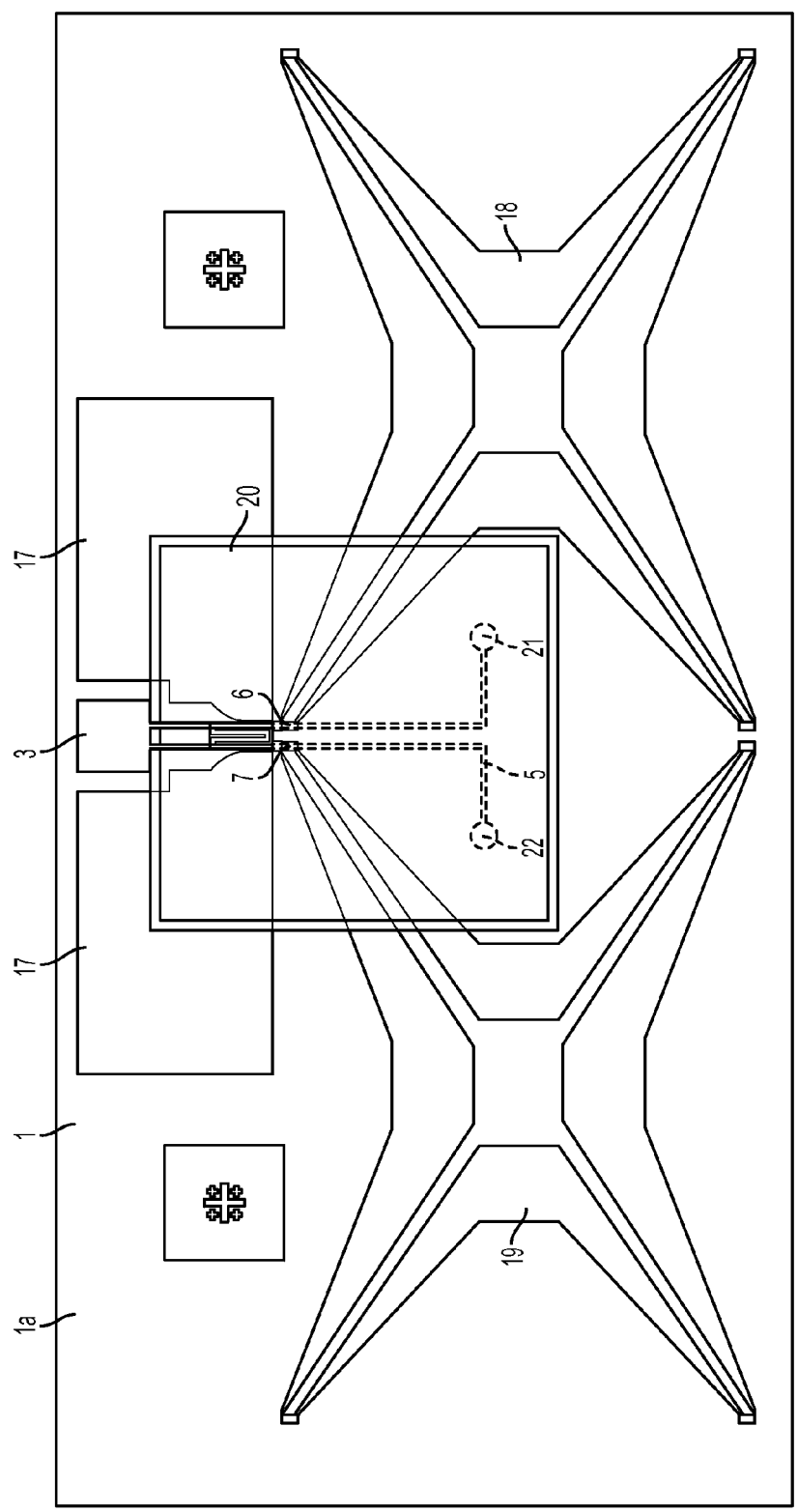

Next, polydimethylsiloxane (PDMS) is used for creating the second substrate 20 containing microfluidic thermal medium channels 5 and inlet connection 21 and outlet connection 22 for pump 12 and heat exchanger 10. Second substrate 20 is created by spin coating a layer of negative photoresist (MicroChem, SU-8 2050) and patterning on a silicon wafer. The width of the microfluidic thermal medium channels 5 is 100 μm. After developing the UV exposed photoresist, a soft mold is formed. Then, PDMS mixture is poured over the soft mold, followed by curing at 80° C. for half an hour. Finally, a PDMS replica is punched to form the inlet connection 21 and outlet connection 22. Second substrate 20 is then positioned on and bonded to first substrate 1 by $O_2$ plasma treatment for 20 seconds. The fabricated second substrate 20 is shown in FIGS. 4a-b. A heat exchanger 10 is affixed to the second substrate 20 on top of the thermal medium channels 5. An micro thermal medium pump 12 drives the thermal medium fluid 4 through thermal medium channels 5 and heat exchanger 10. In some embodiments, micro thermal medium pump 12 is mounted on PCBA 16.

Figure 3:
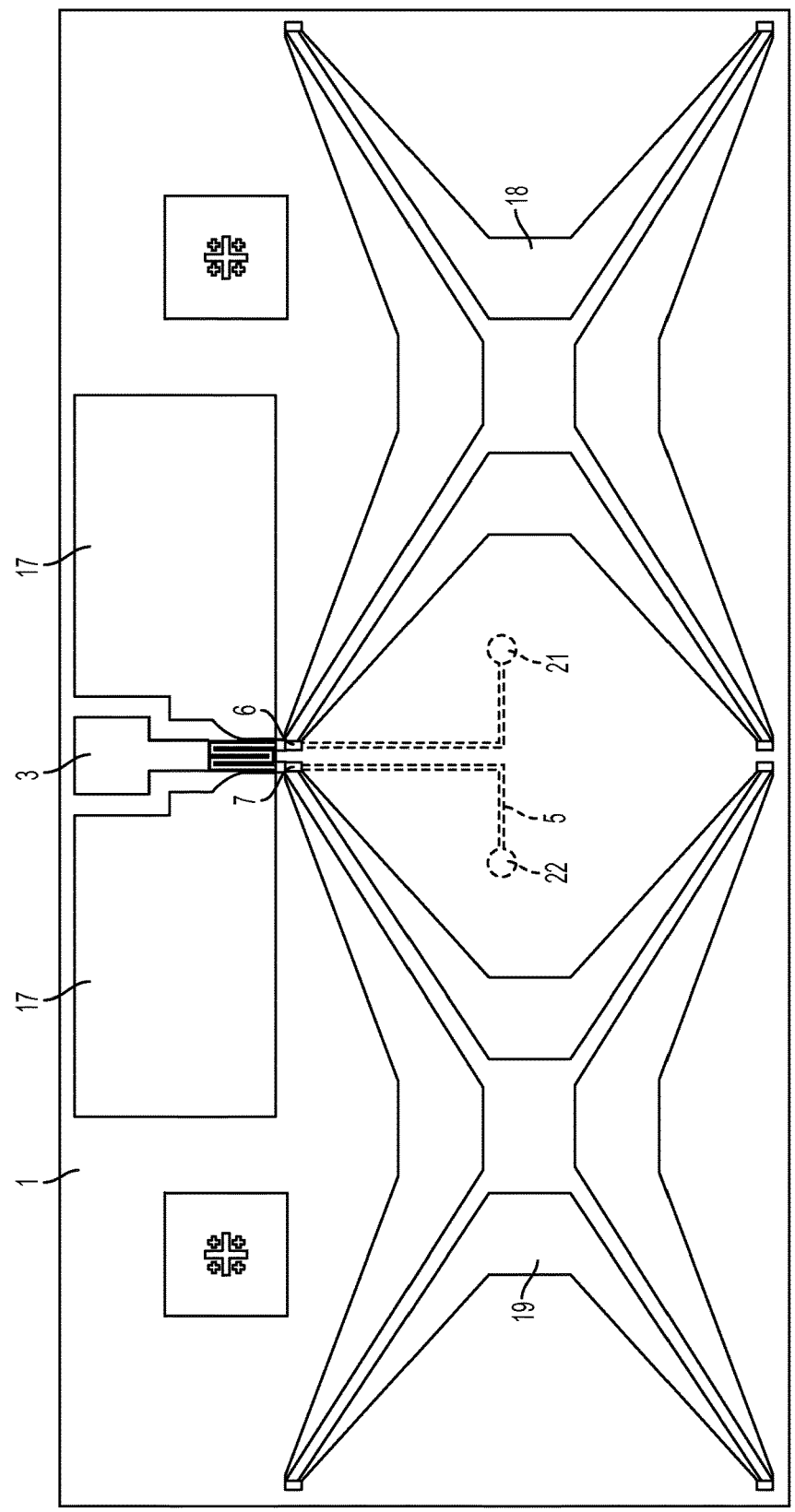
FIG. 3 is a layout of a first substrate of a microfabricated RF power measurement calorimeter in accordance with an embodiment of this invention.
Figure 5:
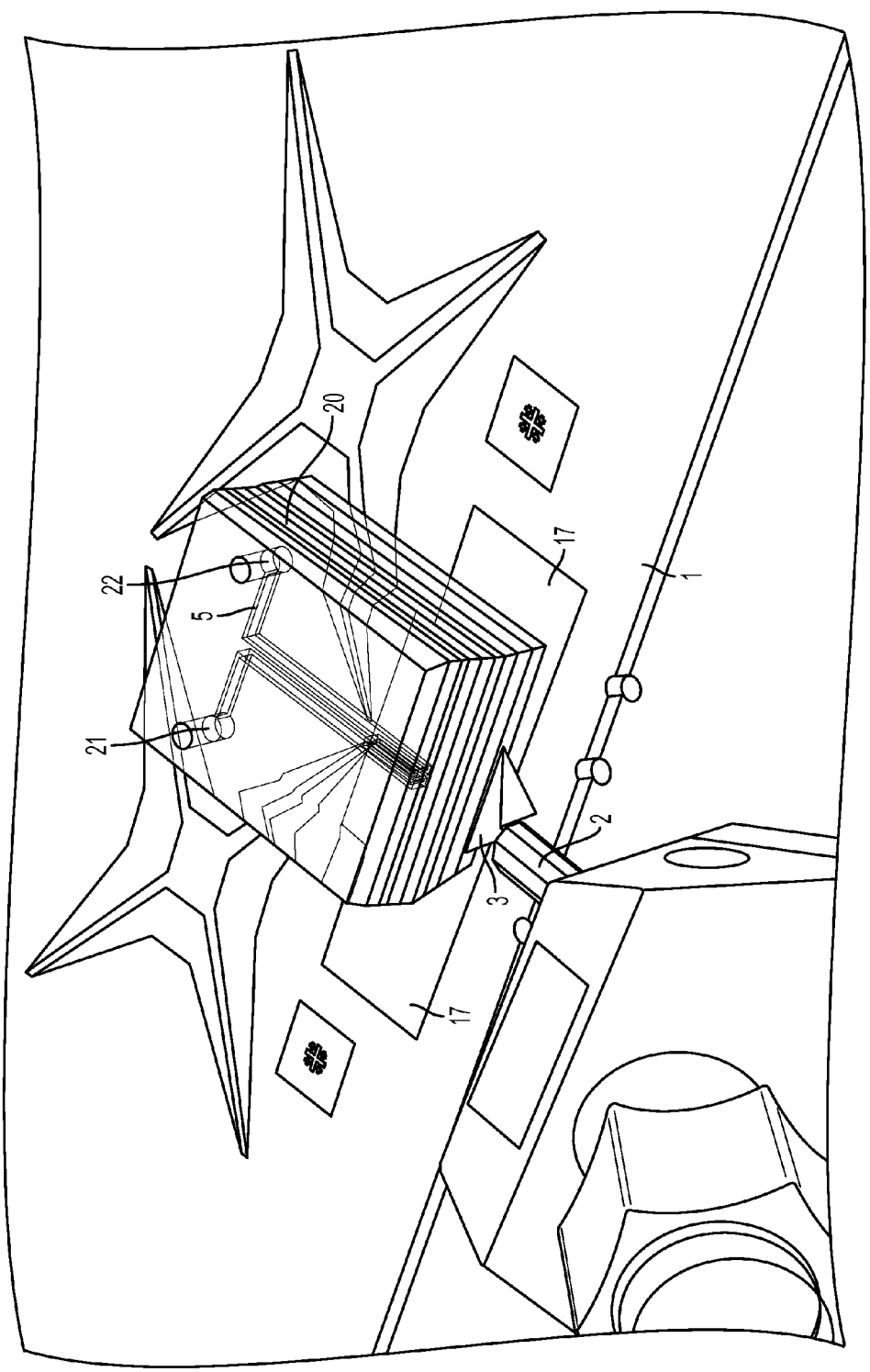
FIG. 5 is a depiction of a first substrate and a second substrate of a microfabricated RF power measurement calorimeter in accordance with an embodiment of this invention.
Figure 6:
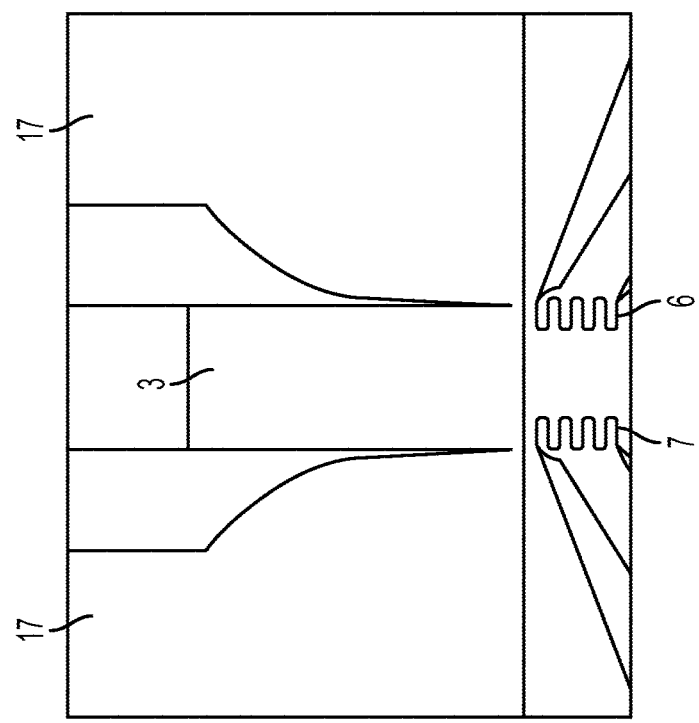
FIG. 6 is a close-up of a section of a first substrate of a microfabricated RF power measurement calorimeter in accordance with an embodiment of this invention.
Figure 7:
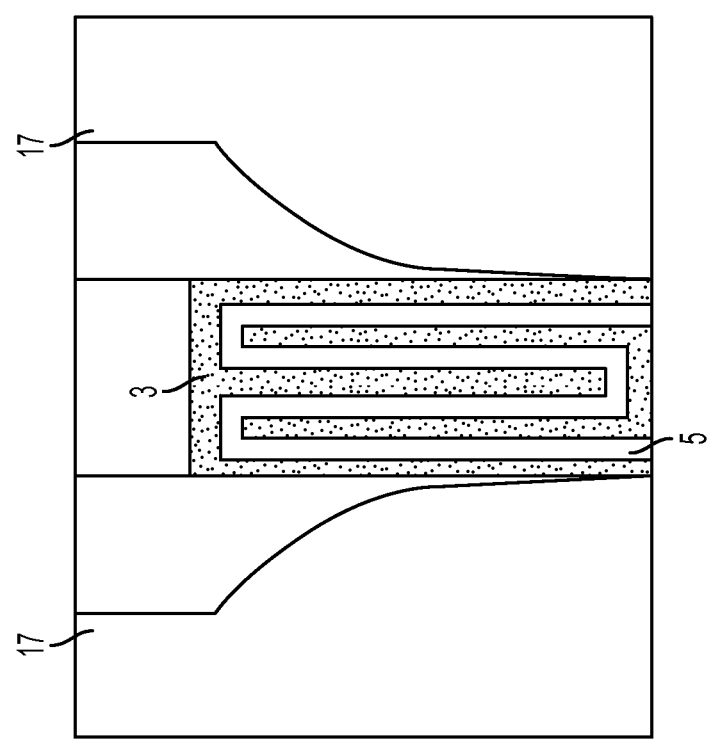
FIG. 7 is a close-up of a section of a first substrate of a microfabricated RF power measurement calorimeter in accordance with an embodiment of this invention.

FIGS. 3 and 4a-b depict the layout of load 3, return current path 17, inlet temperature sensor 6, and outlet temperature sensor 7 microfabricated on first substrate 1. Further depicted are thermal medium channels 5, microfluidic inlet 21, and microfluidic outlet 22 microfabricated on second substrate 20 in accordance with an embodiment of RF power measurement calorimeter 100. FIG. 5 shows second substrate 20 mounted on first substrate 1. Further, FIG. 5 also depicts RF input 2 connected to load 3 and return current path 17 of substrate 1. FIG. 6 is a close up view of inlet temperature sensor 6, outlet temperature 7, load 3, and current return path 17 of first substrate 1 in accordance with an embodiment of RF power measurement calorimeter 100. FIG. 7 is a close up view of load 3 and current return path 17 of first substrate 1, and microfluidic thermal medium channels 5 of second substrate 20 in accordance with an embodiment of RF power measurement calorimeter 100. It is contemplated that in some embodiments of first substrate 1, load 3 and RF input 2 can have conductive material used for current return path 17 deposited on the same side as load 3, on the opposite side of load 3 and RF input 2, or a combination of on the same side and on the opposite side of load 3 and RF input 2 (e.g. suspended co-planer waveguide, grounded microstrip or grounded co-planer waveguide).

As can be seen in FIGS. 3 and 4a-b, in some embodiments, inlet temperature sensor 6 is located in an inlet temperature sensor Wheatstone bridge 18, and outlet temperature sensor 7 is located in an outlet temperature sensor Wheatstone bridge 19 fabricated symmetrically on first substrate 1. The Wheatstone bridges 18 and 19 allow inlet temperature sensor 6 and outlet temperature sensor 7 to detect temperature changes of thermal medium 4 more accurately. Additionally, even though second substrate 20 is not shown in FIG. 3, for ease of understanding, thermal medium channels 5, microfluidic inlet 21, and microfluidic outlet 22 are also depicted in relation to load 3, inlet temperature sensor 6, and outlet temperature sensor 7.

In operation, one pair of the pads on each Wheatstone bridge 18 and 19 are used to apply a DC voltage ($V_{in}$=0.5 V) and the other pair of pads is used to measure the output voltage. The following equation represents the relation between $V_{out}$, $V_{in}$ and $R_{sensor}$ $$V_{out} = \left(\frac{R_{sensor}}{R_3 + R_{sensor}} - \frac{R_2}{R_1 + R_2}\right) * V_{in}$$

Turning to Wheatstone bridge 19, an applied power on the load 3 generates a heat that is transferred from load 3 to thermal medium 4. Once the heated thermal medium 4 reaches outlet temperature sensor 7, the resistance of outlet temperature sensor 7 will increase, therefore causing $V_{out}$ of Wheatstone bridge 19 to increase accordingly. Further, the resistance of outlet temperature sensor 7 decreases when the temperature of thermal medium 4 flowing over outlet temperature sensor 7 decreases, causing $V_{out}$ of Wheatstone bridge 19 to decrease accordingly. Along the same lines, the resistance of inlet temperature sensor 6 decreases when the temperature of thermal medium 4 flowing over inlet temperature sensor 6 decreases, causing $V_{out}$ of Wheatstone bridge 18 to decrease accordingly. Further, the resistance of inlet temperature sensor 6 increases when the temperature of thermal medium 4 flowing over inlet temperature sensor 6 increases, causing $V_{out}$ of Wheatstone bridge 18 to increase accordingly.

Figure 8:
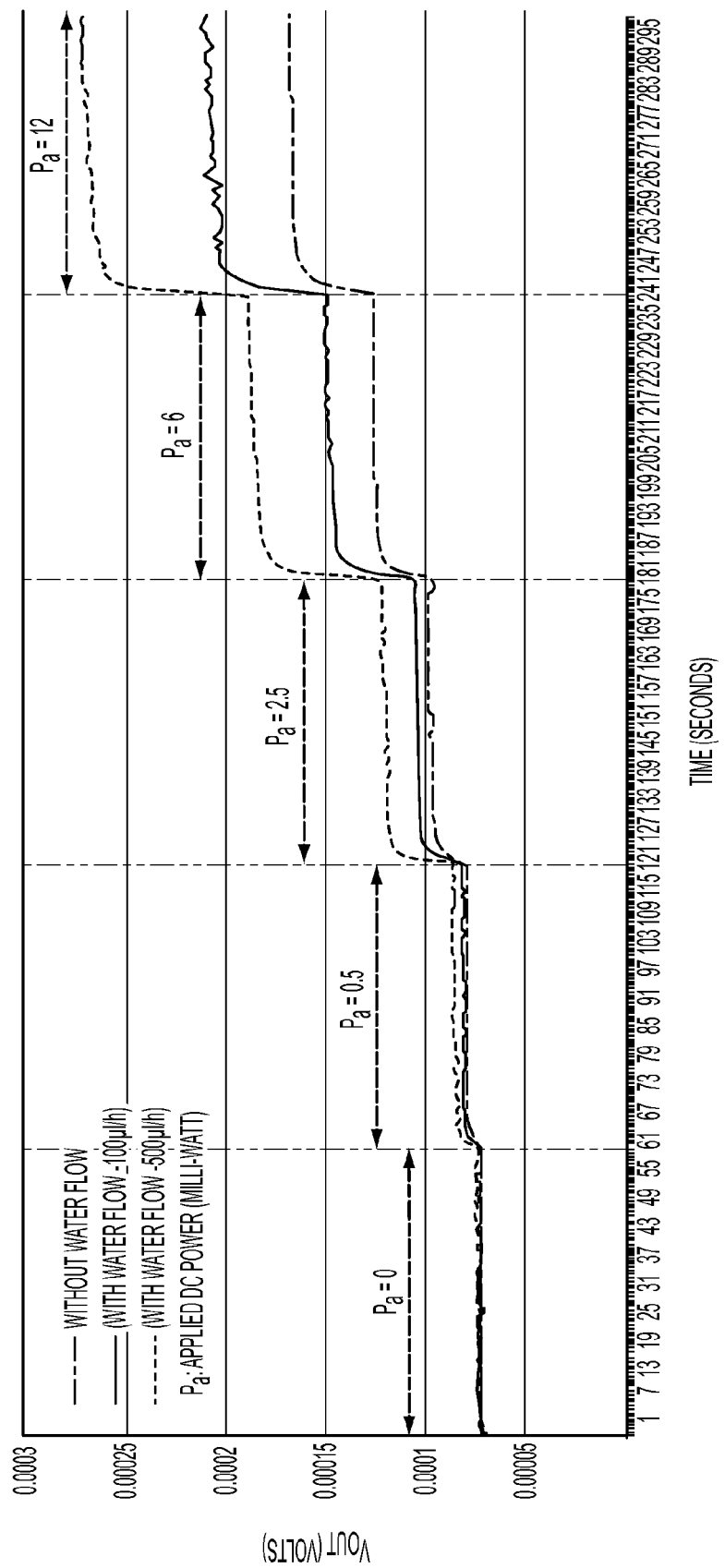
FIG. 8 is a plot of the measured voltage vs. time at different DC powers for a microfabricated RF power measurement calorimeter in accordance with an embodiment of this invention.

FIG. 8 shows $V_{out}$ as a function of time for outlet temperature sensor Wheatstone bridge 19 and applied power at different flow rates. As can be seen, five different DC power values were applied to load 3 in FIG. 8.

Figure 9:
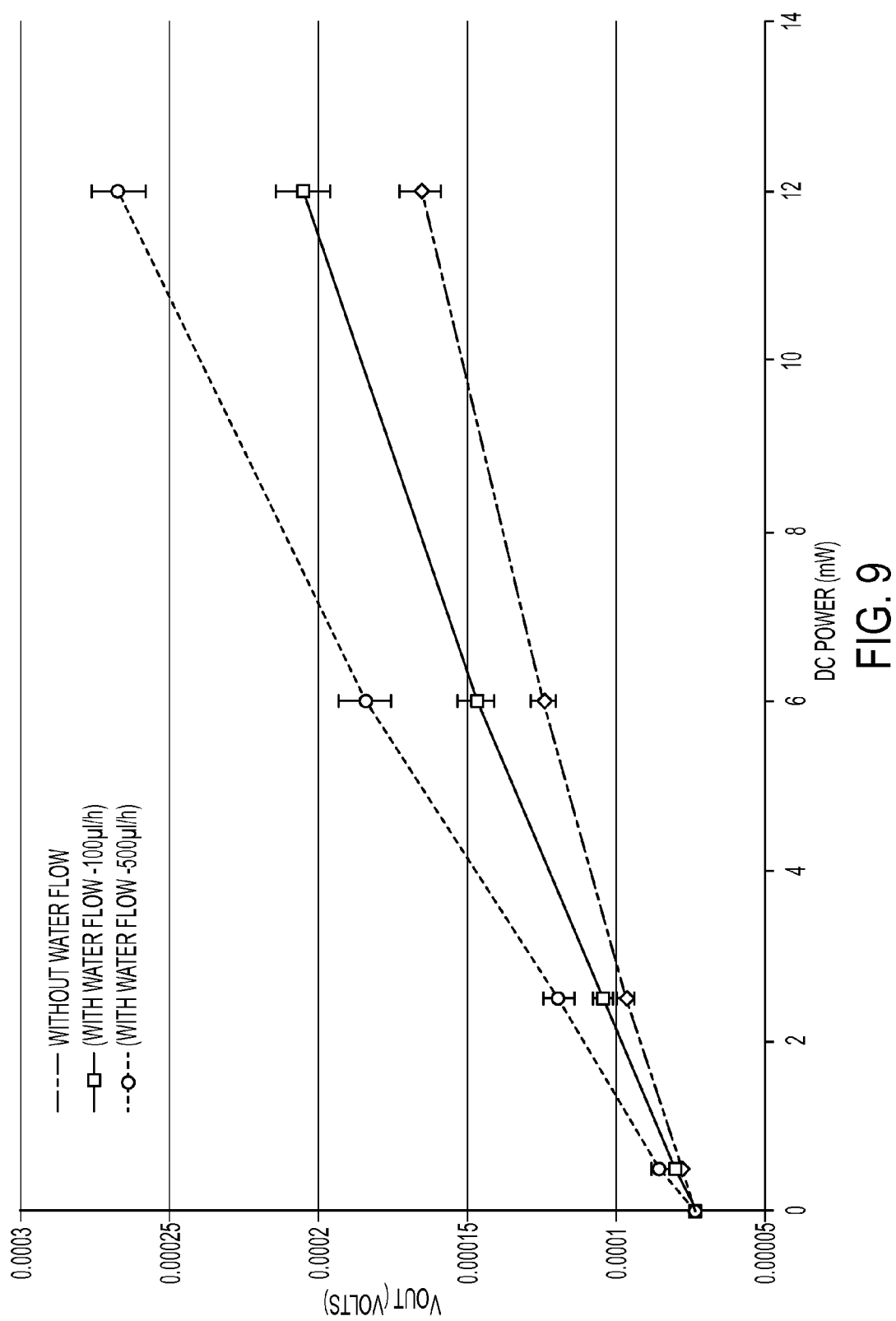
FIG. 9 is a plot of the measured voltage vs. applied DC power at a plurality of flow rates for a microfabricated RF power measurement calorimeter in accordance with an embodiment of this invention.

Further, FIG. 8 also shows that a higher flow rate of thermal medium 4 can transfer more heat from load 3 to outlet temperature sensor 7. This is confirmed in FIG. 9, which demonstrates that a higher flowrate produces a sharper $V_{out}$ vs. applied power slope when a given DC power value is applied to load 3.

Figure 10:
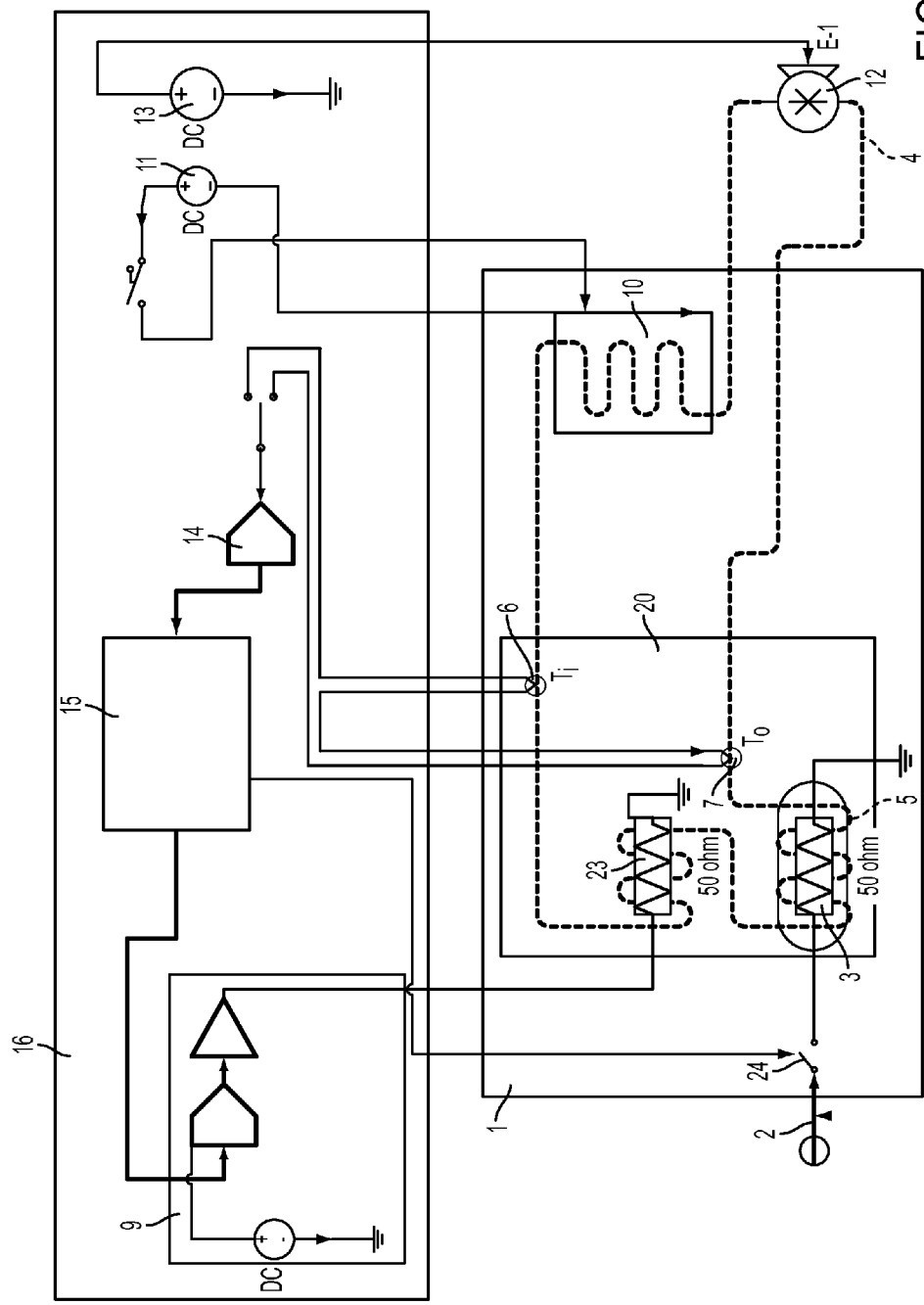
FIG. 10 is a block diagram of a microfabricated RF power measurement calorimeter in accordance with an embodiment of this invention.

FIG. 10 shows an alternative embodiment of RF power measurement calorimeter 100 in which bias tee 8 is eliminated and replaced with a DC load 23 located in close proximity to load 3. In embodiments having a load for RF power received through RF input 2 and a separate load for power received from the variable low frequency power source 9, the load 3 receiving RF power is called is called RF load 3, and the load 23 receiving the variable low frequency power is called DC load 23. During DC substitution, DC load 23 acts as the secondary power source that is used to compare the heating difference between variable low frequency power source 9 and the unknown RF power source received through RF input 2. When RF switch 25 is closed, power is delivered to RF load 3 from unknown RF power source received through RF input 2. RF switch 25 is a single pole single throw switch that is controlled by control and processing electronics 15.

Figure 11:
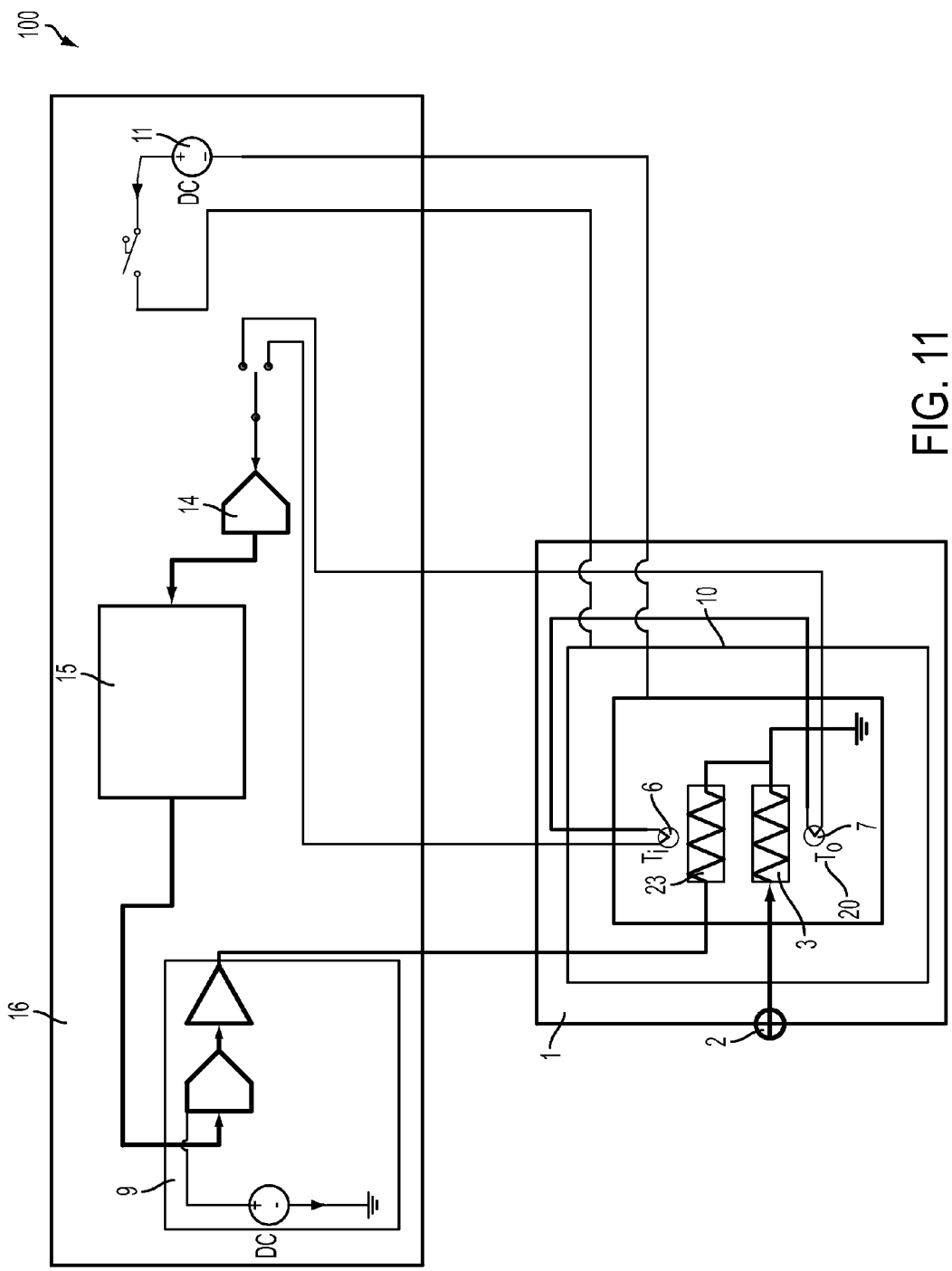
FIG. 11 is a block diagram of a microfabricated RF power measurement calorimeter in accordance with another embodiment of this invention.

FIG. 11 shows a further embodiment of RF power measurement calorimeter 100 in which fluid is not used as thermal medium 4. Instead, first substrate 1 acts as thermal medium 4 and is used to provide a temperature reference. Additionally, a means for maintaining the first substrate 1 at a constant temperature (e.g. a regulated cooling means) is included in the embodiment. Further, it is contemplated that in some embodiments of RF power measurement calorimeter 100, the means for maintaining the first substrate 1 at a constant temperature is an active or passive heat exchanger 10 mounted integral to first substrate 1.

In FIG. 11, first substrate 1 is constructed of glass and provides a base for the following fabricated components: RF load 3, DC load 23, inlet temperature sensor 6, outlet temperature sensor 7, and heat exchanger 10. It is contemplated that the first substrate 1 could also be constructed of other materials including, but not limited to, quartz, ceramic, silicon, or gallium arsenide (GaAs).

In one exemplary embodiment, RF input 2 can be configured as a transmission line of copper that provides an electrical path to RF load 3 and current return path 17 from RF load 3. It is contemplated that the transmission line of RF input 2 could also be constructed of other materials including, but not limited to, aluminum, gold, or platinum. RF load 3 is a resistor made of tantalum nitride (TaN) that absorbs electrical energy and converts the electrical energy to heat. It is contemplated that RF load 3 could also be constructed of other materials including, but not limited to, tantalum, nichrome (NiCr), or rhenium trioxide ($ReO_3$).

DC load 23 is a resistor made of tantalum nitride (TaN) that absorbs electrical energy and converts the electrical energy to heat. It is contemplated that DC load 23 could also be constructed of other materials including, but not limited to, tantalum, nichrome (NiCr), or rhenium trioxide ($ReO_3$). During DC substitution, DC load 23 acts as the secondary power source that is used to compare the heating difference between variable low frequency power source 9 and the unknown RF power source received through RF input 2. Temperature sensors 6 and 7 measure the temperature of first substrate 1 to determine thermal equilibrium. Further, heat exchanger 10 cools the first substrate 1 and maintains the first substrate 1 at a fixed temperature value. Temperature measurement electronics 14 convert electrical signals from the temperature sensors 6 and 7 into a voltage or numeric value. Control and processing electronics 15 read the temperature of temperature sensors 6 and 7, control variable low frequency power source 9, and process the temperature measurements of sensors 6 and 7.

Further, variable low frequency power source 9 applies a precision variable DC or low frequency voltage to DC load 23. After thermal equilibrium of first substrate 1 is reached, the reduction of power to DC load 23 is used to determine the RF power present on RF load 3.

As is noted above, RF power measurement calorimeter 100 uses DC substitution to measure the RF power delivered to load 3 through RF input 2. DC substitution uses a secondary precision power source, such as variable low frequency power source 9, and compares the heating difference between the power applied to load 3 by variable low frequency power source 9 and the unknown RF power delivered to load 3 through RF input 2.

DC substitution uses a precision, low-frequency power source to compare the heating difference between the low-frequency power source having a known output power value and an RF power source having an unknown output power value. The amount of power by which the low-frequency source must be reduced to maintain thermal equilibrium is used to determine the power of the unknown RF source. Power from a low-frequency voltage source can be determined to a much higher level of accuracy then direct measurement of high-frequency power, such as RF or microwave power.

It is contemplated that in some embodiments of RF power measurement calorimeter 100, the flowrate of thermal medium cooling fluid 4 presented to load 3, inlet temperature sensor 6, and outlet temperature sensor 7 can be selectable or variable in order to improve the power measurement range of RF power measurement calorimeter 100. Variation of the flow rate of thermal medium cooling fluid 4 along thermal medium channels 5 to load 3, inlet temperature sensor 6, and outlet temperature sensor 7 helps to maintain maximum temperature sensitivity over varying power loads. For example, for lower power measurements, lower flowrates can be used to increase sensitivity, while higher power measurements benefit from higher flowrates to reduce load failure. Any change in flowrate of thermal medium cooling fluid 4 along thermal medium channels 5 requires the flowrate to be stabilized and a unique DC calibration, such as those discussed and shown in FIGS. 12-14, prior to any power measurement.

Figure 15:
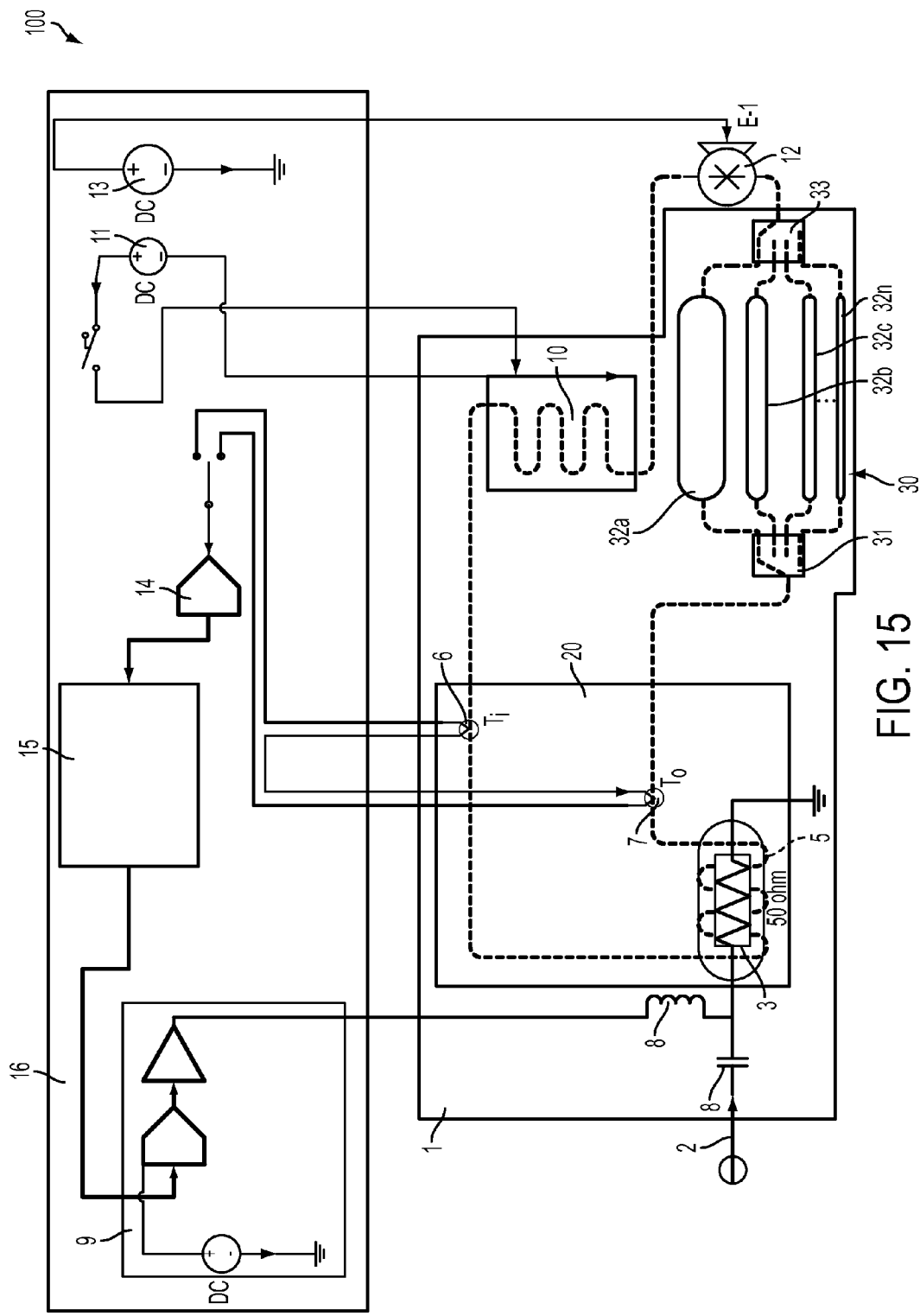
FIG. 15 is a block diagram of a microfabricated RF power measurement calorimeter in accordance with an embodiment of this invention.

Turning to FIG. 15, some embodiments of RF power measurement calorimeter 100 have a fluid channel path array 30 that can be used to change the flowrate of thermal medium cooling fluid 4 travelling along thermal medium channels 5. In the embodiment shown in FIG. 15, the fluid channel path array 30 is located between outlet temperature sensor 7 and thermal medium pump 12, however, it is contemplated that a person having ordinary skill in the art can choose to place fluid channel path array 30 at another location along thermal medium channel 5.

Fluid channel path array 30 has an upstream fluid switch 31, a downstream fluid switch 33, and multiple fluid channels 32a-n, with "n" being the letter in the alphabet corresponding to the number of fluid channels 32. Upstream fluid switch 31 and downstream fluid switch 33 are fluidly connected to and configured to switch the flow of thermal medium cooling fluid 4 between fluid channels 32a-n, thereby directing thermal medium cooling fluid 4 along only one of the multiple fluid channels 32a-n at a given time; such as when upstream fluid switch 31 is configured to direct thermal medium cooling fluid 4 along fluid channel 32a, downstream fluid switch 33 will be configured to receive thermal medium cooling fluid 4 from fluid channel 32a and direct the thermal medium cooling fluid 4 from fluid channel 32a downstream through thermal medium channel 5. Each of the multiple fluid channels 32a-n is uniquely modified in its length and/or hydraulic diameter, thereby presenting different pressure drops to thermal medium pump 12.

It is contemplated that one or both of upstream fluid switch 31 and downstream fluid switch 33 can be a valve and/or manifold. It is contemplated that fluid channel path array 30 can be directly integrated onto first substrate 1, or externally mounted. Further, it is contemplated that any of upstream fluid switch 31, fluid channels 32a-n, and/or downstream fluid switch 33 can be directly integrated onto first substrate 1, or externally mounted. It is contemplated that in some embodiments, upstream fluid switch 31 and downstream fluid switch 33 are manually switched. In other embodiments, the switching of upstream fluid switch 31 and downstream fluid switch 33 are controlled by control and processing electronics 15.

Figure 16:
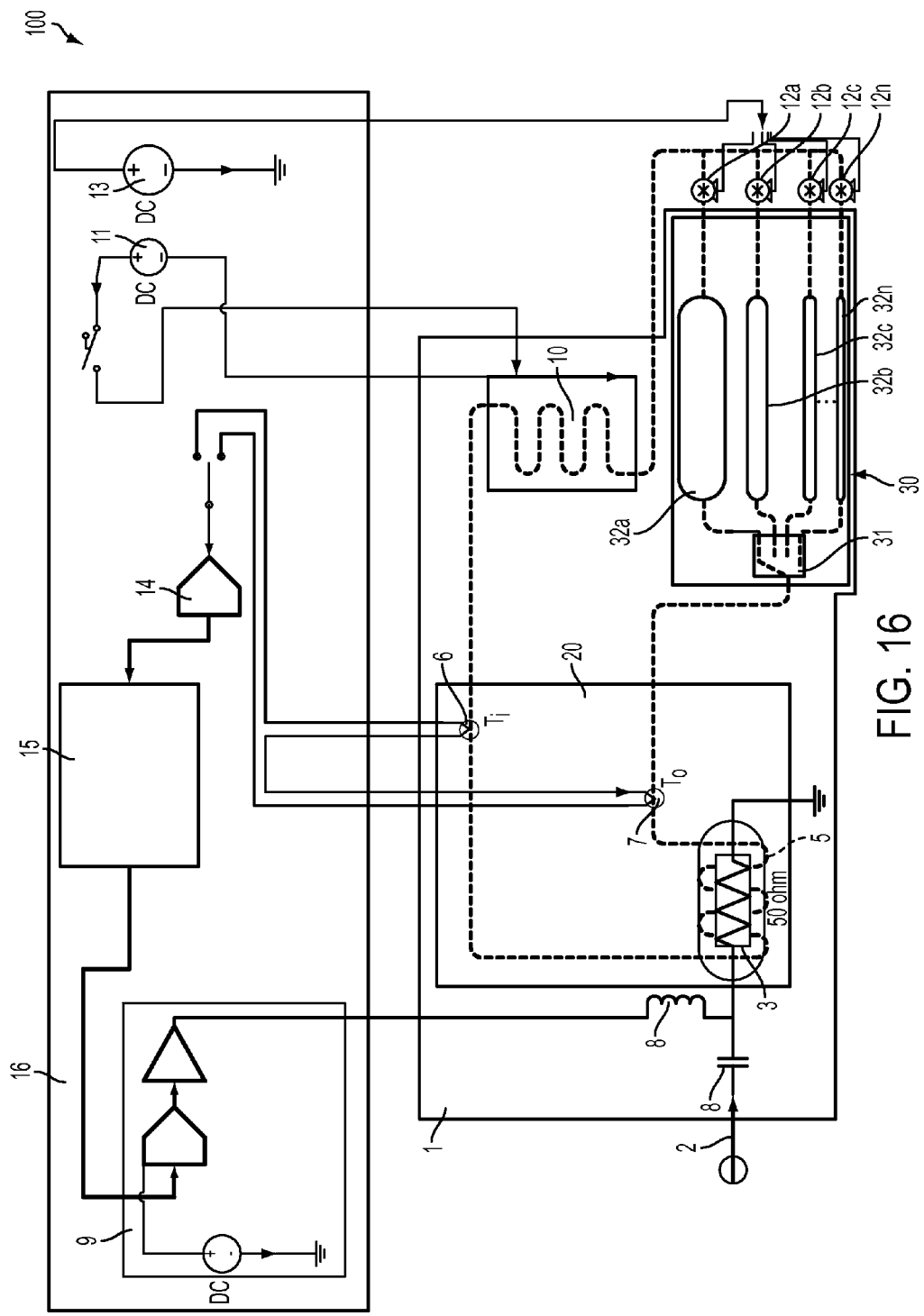
FIG. 16 is a block diagram of a microfabricated RF power measurement calorimeter in accordance with an embodiment of this invention.

Turning to FIG. 16, other some embodiments of RF power measurement calorimeter 100 have a fluid channel path array 30 having an upstream fluid switch 31 and multiple fluid channels 32a-n. Each of the multiple fluid channels 32a-n has a thermal medium pump 12a-n. In some embodiments, thermal medium pumps 12a-n share a single thermal medium pump power source 13 that is capable of powering one thermal medium pump 12a-n at a given time. In other embodiments, each thermal medium pump 12a-n is individually powered by a corresponding thermal medium pump power source 13a-n. Upstream fluid switch 31, multiple fluid channels 32a-n, and thermal medium pumps 12a-n are fluidly connected and configured to switch the flow of thermal medium cooling fluid 4 between fluid channels 32a-n, thereby directing thermal medium cooling fluid along only one of the multiple fluid channels 32a-n at a given time; such as when upstream fluid switch 31 is configured to direct thermal medium cooling fluid 4 along fluid channel 32a, the corresponding thermal medium power source 13 will power the corresponding thermal medium pump 12a.

It is contemplated that any of fluid channel path array 30, thermal medium pump 12a-n, and/or thermal medium pump power source 13a-n can be directly integrated onto first substrate 1, or externally mounted. Further, it is contemplated that any of upstream fluid switch 31, fluid channels 32a-n, and/or downstream fluid switch 33 can be directly integrated onto first substrate 1, or externally mounted. It is contemplated that in some embodiments, upstream fluid switch 31 and thermal medium power source 13 are manually switched. In other embodiments, the switching of upstream fluid switch 31 and thermal medium power source 13 are controlled by control and processing electronics 15.

Further, it is also contemplated that in some embodiments of RF power measurement calorimeter 100, thermal medium pump power source 13 of thermal medium pump 12 is configured to be reduced or modulated to vary the flowrate of thermal medium cooling fluid 4 along thermal medium channel 5. It is contemplated that in some embodiments, the reduction or modulation of thermal medium pump power source 13 of thermal medium pump 12 is manually performed. In other embodiments, it is contemplated that the reduction or modulation of thermal medium pump power source 13 of thermal medium pump 12 is controlled by control and processing electronics 15. It is contemplated that any one or more of the methods and structures for varying the flowrate of thermal medium cooling fluid 4 along thermal medium channel 5 discussed and/or shown in this application can be used alone or in combination in an embodiment of RF power measurement calorimeter 100.

Figure 12:
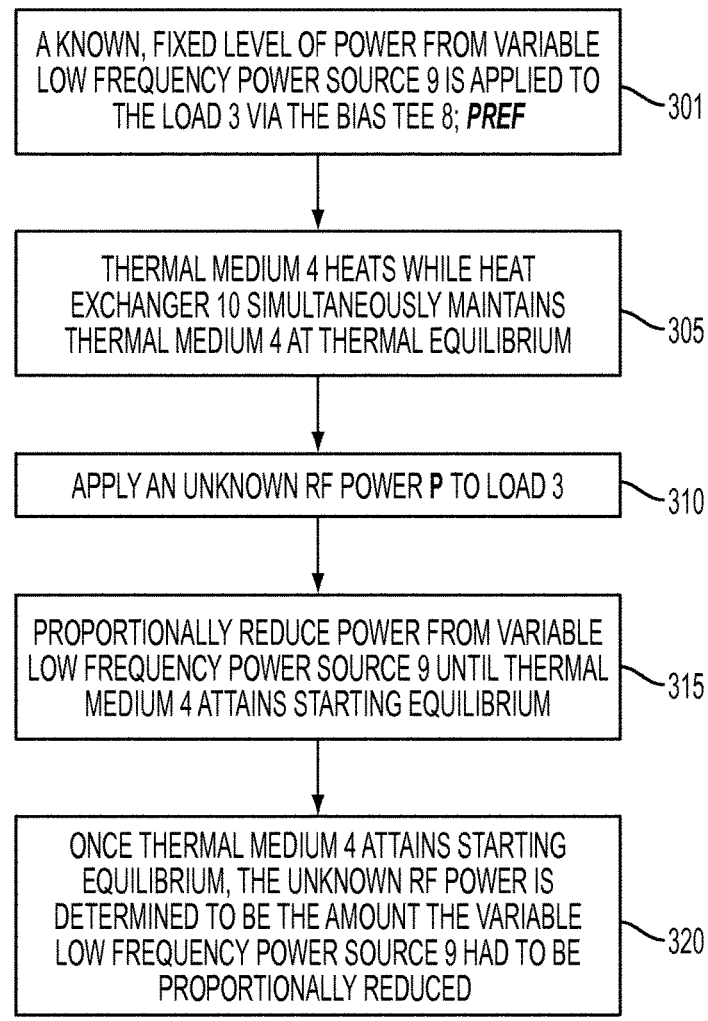
FIG. 12 is a flow chart of a method of measuring power using a microfabricated RF power measurement calorimeter in accordance with an embodiment of this invention.

FIG. 12 shows one method of DC substitution that can be used in conjunction with an embodiment of RF power measurement calorimeter 100. In step 301, A known, fixed level of power from variable low frequency power source 9 is applied to the load 3 via the bias tee 8: Pref. The value of this initial, fixed power is $P_{eq}=(V_{eq})^2/R_{load}$.

In step 305, the thermal medium 4 is allowed to heat while the active or passive heat exchanger 10 simultaneously maintains the thermal medium 4 at thermal equilibrium. This equilibrium is determined by the inlet temperature sensor 6 as Tin. The temperature of the thermal medium 4 (exiting fluid or of the first substrate 1) is monitored by the outlet temperature sensor 7 also at equilibrium: Tout. These initial temperatures, $T_{ineq}$ & $T_{outeq}$, are monitored by measurement electronics 14.

In step 310, an unknown RF power P is now applied to the load 3 via the RF input 2. This unknown RF power must be equal to or less than $P_{eq}$. The total power applied to the load 3 will be the sum of the known & unknown powers: Pref+P.

In step 315, initially this sum is greater than $P_{eq}$ and the fluid or substrate temperature of thermal medium 4 will rise. The known power from the variable low frequency power source 9 is proportionately reduced by control electronics 15 until thermal medium 4 attains starting equilibrium as determined when Tout=$T_{outeq}$. Let this reduced power be $P_{meas}$. The inlet temperature Tin must also be maintained at Tin=$T_{ineq}$ by the heat exchanger 10.

In step 320, when these conditions are met, the unknown RF power can be determined by the amount the known power source had to be proportionately reduced: $P=P_{eq}-P_{meas}$.

It is understood that if the unknown power is zero, then $P_{meas}=P_{eq}$.

One advantage of this measurement technique is power from a low-frequency voltage source Pref can be determined to a much higher level of accuracy then direct measurement of high-frequency (e.g. RF) power.

Figure 13:
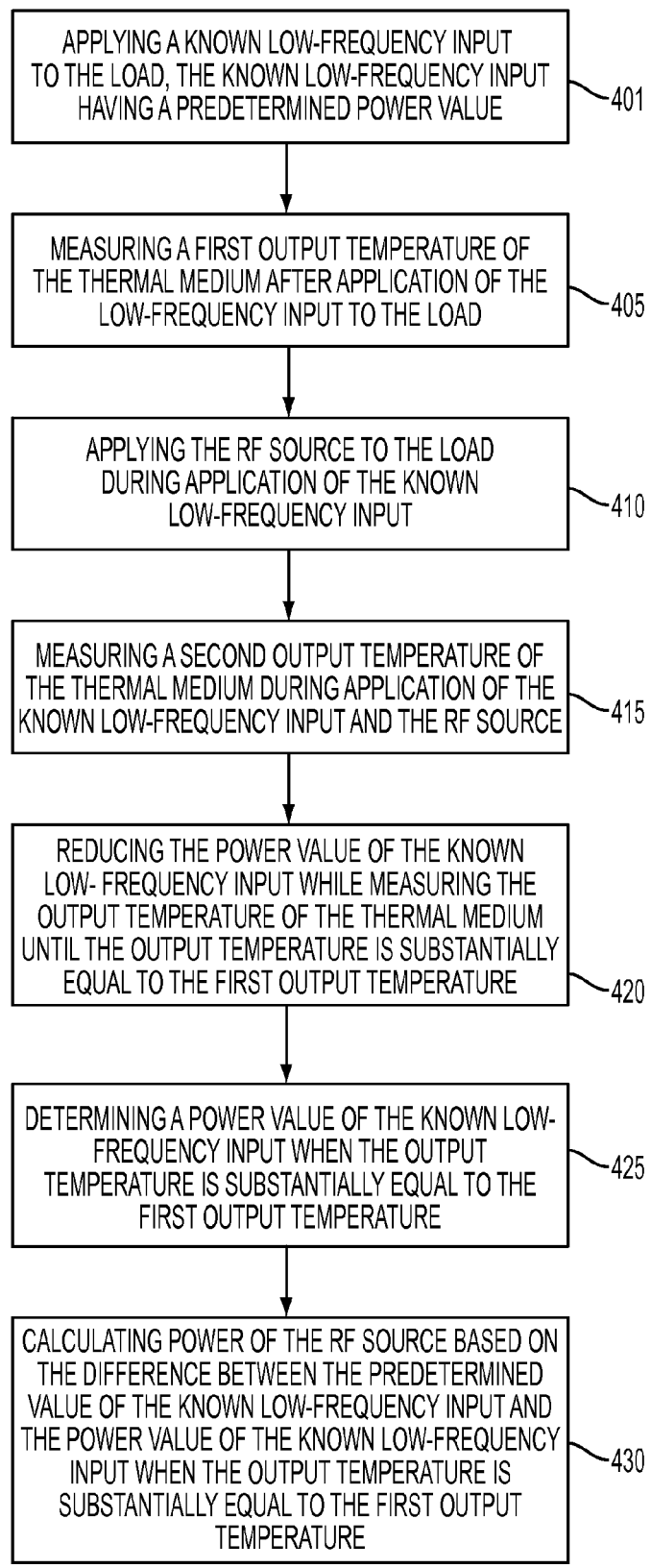
FIG. 13 is a flow chart of another method of measuring power using a microfabricated RF power measurement calorimeter in accordance with an embodiment of this invention.

Turning to FIG. 13, shown is another embodiment of determining an average power of the RF source. In step 401, a known low-frequency input from variable low frequency power source 9 is applied to the load 3. The known low-frequency input has a predetermined power value. In step 405, a first output temperature of thermal medium 4 is measured by outlet temperature sensor 7 after application of the low-frequency input to load 3.

In step 410, an RF source having an unknown power is applied to load 3 during application of the known low-frequency input. In step 415, a second output temperature of the thermal medium 4 is measured by outlet temperature sensor 7 during application of the known low-frequency input and the RF source having an unknown power value.

In step 420, the power value of the known low-frequency input is reduced while measuring the output temperature of thermal medium 4 using outlet temperature sensor 7 until the output temperature is substantially equal to the first output temperature. In step 425, a power value of the known low-frequency input is determined when the output temperature measured by outlet temperature sensor 7 in step 420 is substantially equal to the first output temperature measured by outlet temperature sensor 7 in step 401.

In step 430, a value for the unknown power of the RF source is calculated based on the difference between the predetermined power value of the known low-frequency input in step 401 and the power value of the known low-frequency input when the output temperature is substantially equal to the first output temperature at the end of step 420.

Figure 14:
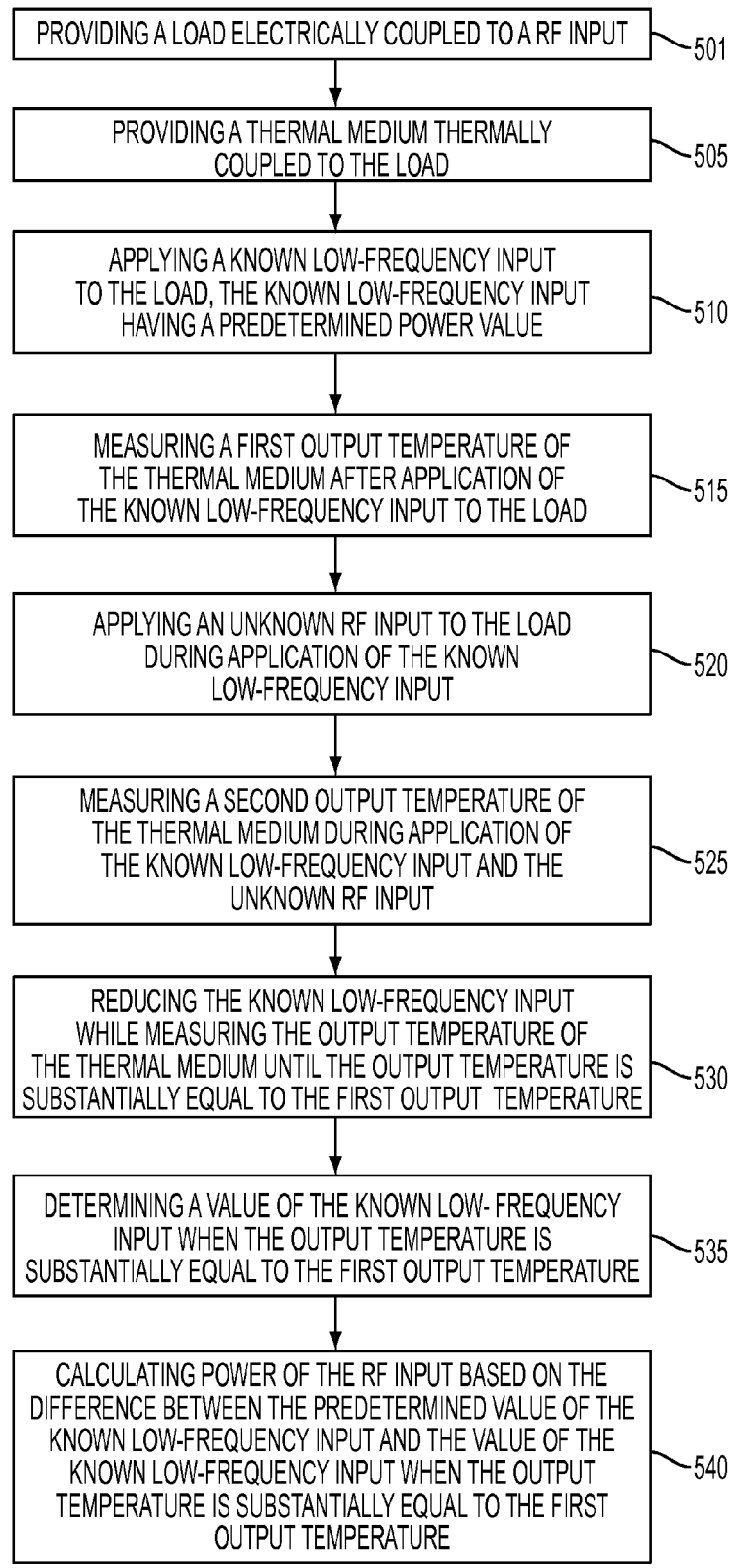
FIG. 14 is a flow chart of an additional method of measuring power using a microfabricated RF power measurement calorimeter in accordance with an embodiment of this invention.

Turning to FIG. 14, also disclosed is a method of measuring RF power. In step 501, a load 3 electrically coupled to a RF input 2 is provided. In step 505, a thermal medium 4 thermally coupled to the load 3 is provided. In step 510, a known low-frequency input from variable low frequency power source 9 is applied to the load 3. The known low-frequency input has a predetermined power value.

In step 515, a first output temperature of the thermal medium 4 is measured after application of the known low-frequency input to the load 3. In step 520, an RF input having an unknown power is applied to the load 3 during application of the known low-frequency input.

In step 525, a second output temperature of the thermal medium 4 is measured during application of the known low-frequency input and the unknown RF input. In step 530, the known low-frequency input is reduced while measuring the output temperature of the thermal medium 4 until the output temperature is substantially equal to the first output temperature.

In step 535, a value of the known low-frequency input is determined when the output temperature is substantially equal to the first output temperature. In step 540, a value for the known power of the RF input is calculated based on the difference between the predetermined power value of the known low-frequency input and the power value of the known low-frequency input when the output temperature is substantially equal to the first output temperature.

While this invention has been described in conjunction with the specific embodiments described above, it is evident that many alternatives, combinations, modifications and variations are apparent to those skilled in the art. Accordingly, the preferred embodiments of this invention, as set forth above are intended to be illustrative only, and not in a limiting sense. Various changes can be made without departing from the spirit and scope of this invention. Combinations of the above embodiments and other embodiments will be apparent to those of skill in the art upon studying the above description and are intended to be embraced therein. Therefore, the scope of the present invention is defined by the appended claims, and all devices, processes, and methods that come within the meaning of the claims, either literally or by equivalence, are intended to be embraced therein.

What is claimed is:

1. A radio frequency (RF) power calorimeter comprising:
   a load electrically coupled to a RF input, the RF input configured to be electrically coupled to an RF power source;
   a variable low-frequency power source electrically coupled to the load and configured to apply low-frequency power to the load;
   a thermal medium thermally coupled to the load;
   an outlet temperature sensor thermally coupled to the thermal medium, the outlet temperature sensor being positioned to measure the temperature of the thermal medium due to heating by the load;
   circuitry configured to calculate power of the RF source electrically coupled to the RF input by: determining an average power of the RF source based on temperature measurements of the thermal medium using a variable bias from the low-frequency power source;
   a single fluid loop comprising a fluid channel path array configured to vary a flowrate of said thermal medium through said single fluid loop.

2. An RF power calorimeter of claim 1, wherein said thermal medium is a fluid circulated through said thermal medium loop and said flowrate of said thermal medium fluid through said thermal medium loop is variable.

3. The RF power calorimeter of claim 1, wherein said fluid channel path array is comprised of a fluid switch in fluid communication with multiple fluid channels, each fluid channel of said fluid channel path array having a different length and/or hydraulic diameter, and each fluid channel of said fluid channel path array has a thermal medium pump.

4. The RF power calorimeter of claim 3, wherein determining an average power of the RF source includes:
applying a known low-frequency input to the load, the known low-frequency input having a predetermined power value;
measuring a first output temperature of the thermal medium after application of the low-frequency input to the load;
applying the RF source to the load during application of the known low-frequency input;
measuring a second output temperature of the thermal medium during application of the known low-frequency input and the RF source;
reducing the power value of the known low-frequency input while measuring the output temperature of the thermal medium until the output temperature is substantially equal to the first output temperature;
determining a power value of the known low-frequency input when the output temperature is substantially equal to the first output temperature; and
calculating power of the RF source based on the difference between the predetermined value of the known low-frequency input and the power value of the known low-frequency input when the output temperature is substantially equal to the first output temperature.

5. An RF power calorimeter as set forth in claim 4, wherein said variable low-frequency power source is an alternating current voltage source or a direct current voltage source.

6. An RF power calorimeter as set forth in claim 5, wherein said thermal medium is a substrate thermally coupled to a heat exchanger, said outlet temperature sensor is a Wheatstone bridge, said power calorimeter is configured to measure power between about 100 .mu.W and 100 mW, and said power calorimeter is configured to measure power at frequencies down to 0 Hz and well above 12 GHz.

7. An RF power calorimeter as set forth in claim 6, wherein said RF power calorimeter is further comprised of a non-conductive substrate; wherein said load and output sensor are microfabricated on said non-conductive substrate.

8. An RF power calorimeter comprised of a microfabricated calorimeter having a thermal medium and a low frequency power source; said power calorimeter is configured to determine an average power of an RF source based on temperature measurements of said thermal medium using a variable bias from the low-frequency power source; a single fluid loop comprising a fluid channel path array configured to vary a flowrate of said thermal medium through said single fluid loop.

9. A method of measuring radio frequency (RF) power, the method comprising:
providing a load electrically coupled to a RF input;
providing a thermal medium thermally coupled to the load;
applying a known low-frequency input to the load, the known low-frequency input having a predetermined power value;
measuring a first output temperature of the thermal medium after application of the known low-frequency input to the load;
applying an unknown RF input to the load during application of the known low-frequency input;
measuring a second output temperature of the thermal medium during application of the known low-frequency input and the unknown RF input;
reducing the known low-frequency input while measuring the output temperature of the thermal medium until the output temperature is substantially equal to the first output temperature;
determining a value of the known low-frequency input when the output temperature is substantially equal to the first output temperature; and
calculating power of the RF input based on the difference between the predetermined value of the known low-frequency input and the value of the known low-frequency input when the output temperature is substantially equal to the first output temperature;
wherein a single fluid loop comprising a fluid channel path array is configured to vary a flowrate of said thermal medium through said single fluid loop.

10. The method of claim 9, wherein said method is carried out using a microfabricated RF power calorimeter and said known low-frequency input is an alternating current voltage source or a direct current voltage source.

11. The RF power calorimeter of claim 9, wherein said fluid channel path array is comprised of a fluid switch in fluid communication with multiple fluid channels, each fluid channel of said fluid channel path array having a different length and/or hydraulic diameter, and each fluid channel of said fluid channel path array has a thermal medium pump.

12. The method as set forth in claim 10, wherein said thermal medium is a substrate thermally coupled to a heat exchanger, said output temperature is obtained with a Wheatstone bridge temperature sensor, said power calorimeter is configured to measure power between about 100 .mu.W and 100 mW, and said power calorimeter is configured to measure power at frequencies down to 0 Hz and well above 12 GHz.

13. The method as set forth in claim 10, wherein said RF power calorimeter is further comprised of a non-conductive substrate; wherein said load and output sensor are microfabricated on said non-conductive substrate.

* * * * *